(12) United States Patent
Matsubara et al.

(10) Patent No.: US 9,368,474 B2
(45) Date of Patent: Jun. 14, 2016

(54) MANUFACTURING METHOD FOR SEMICONDUCTOR DEVICE

(71) Applicant: J-DEVICES CORPORATION, Oita (JP)

(72) Inventors: Hiroaki Matsubara, Kanagawa (JP); Tomoshige Chikai, Kanagawa (JP); Kiminori Ishido, Kanagawa (JP); Takashi Nakamura, Kanagawa (JP); Hirokazu Honda, Kanagawa (JP); Hiroshi Demachi, Kanagawa (JP); Yoshikazu Kumagaya, Miyagi (JP); Shotaro Sakumoto, Kanagawa (JP); Shinji Watanabe, Kanagawa (JP); Sumikazu Hosoyamada, Oita (JP); Shingo Nakamura, Kanagawa (JP); Takeshi Miyakoshi, Hokkaido (JP); Toshihiro Iwasaki, Kanagawa (JP); Michiaki Tamakawa, Kanagawa (JP)

(73) Assignee: J-DEVICES CORPORATION, Oita (JP)

(*) Notice: Subject to any disclaimer, the term of this patent is extended or adjusted under 35 U.S.C. 154(b) by 0 days.

(21) Appl. No.: 14/850,589

(22) Filed: Sep. 10, 2015

(65) Prior Publication Data
US 2016/0079204 A1    Mar. 17, 2016

(30) Foreign Application Priority Data
Sep. 11, 2014  (JP) .................................. 2014-185708

(51) Int. Cl.
*H01L 23/00*  (2006.01)
*H01L 25/065*  (2006.01)
(Continued)

(52) U.S. Cl.
CPC ............ *H01L 24/96* (2013.01); *H01L 21/3043* (2013.01); *H01L 21/561* (2013.01);
(Continued)

(58) Field of Classification Search
CPC .............. H01L 25/0657; H01L 23/481; H01L 2224/81; H01L 21/304; H01L 21/78; H01L 23/49827; H01L 23/3114; H01L 2924/1461; H01L 23/49822; H01L 24/27
See application file for complete search history.

(56) References Cited

U.S. PATENT DOCUMENTS 5,191,405 A * 3/1993 Tomita .................. H01L 23/481
257/763
6,482,730 B1    11/2002 Masumoto et al.
(Continued)

FOREIGN PATENT DOCUMENTS

| JP | 2010-267653 A | 11/2010 |
| JP | 4809957 B2 | 11/2011 |
| JP | 2012-084780 A | 4/2012 |

*Primary Examiner* — Karen Kusumakar
(74) *Attorney, Agent, or Firm* — Typha IP LLC

(57) ABSTRACT

A manufacturing method for a semiconductor device of the present invention includes: preparing a semiconductor wafer including an electrode formed therein; electrically connecting a first semiconductor element formed in a semiconductor chip and the electrode formed in the semiconductor wafer; filling a gap between the semiconductor wafer and the semiconductor chip with a first insulating resin layer; forming a second insulating resin layer on the semiconductor wafer; grinding the second insulating resin layer and the semiconductor chip until a thickness of the semiconductor chip reaches a predetermined thickness; forming a first insulating layer on the second insulating resin layer and the semiconductor chip; forming a line on the first insulating layer connected with a conductive material filled an opening in the first insulating layer and the second insulating resin layer to expose the electrode; and grinding the semiconductor wafer until a thickness of the semiconductor wafer reaches a predetermined thickness.

21 Claims, 36 Drawing Sheets

(51) Int. Cl.
  *H01L 21/78* (2006.01)
  *H01L 21/56* (2006.01)
  *H01L 21/304* (2006.01)

(52) U.S. Cl.
  CPC .............. *H01L21/565* (2013.01); *H01L 21/78* (2013.01); *H01L 24/81* (2013.01); *H01L 2224/18* (2013.01); *H01L 2924/3511* (2013.01)

(56) References Cited

U.S. PATENT DOCUMENTS

| | | | |
|---|---|---|---|
| 2007/0096292 A1* | 5/2007 | Machida | H01L 21/4857 257/700 |
| 2012/0088331 A1* | 4/2012 | Kinzer | H01L 21/76898 438/108 |
| 2012/0119373 A1* | 5/2012 | Hunt | H01L 21/565 257/774 |
| 2012/0175732 A1* | 7/2012 | Lin | H01L 23/49816 257/531 |
| 2012/0199972 A1* | 8/2012 | Pagaila | H01L 21/6835 257/737 |
| 2013/0037950 A1* | 2/2013 | Yu | H01L 23/49816 257/738 |
| 2013/0154092 A1* | 6/2013 | Yang | H01L 25/0657 257/738 |
| 2013/0292684 A1* | 11/2013 | Nikitin | H01L 24/03 257/76 |

* cited by examiner

MANUFACTURING METHOD FOR SEMICONDUCTOR DEVICE

CROSS-REFERENCE TO RELATED APPLICATIONS

This application is based upon and claims the benefit of priority from Japanese Patent Application No. 2014-185708, filed on Sep. 11, 2014, the entire contents of which are incorporated herein by reference.

FIELD

The present invention relates to a manufacturing method for a semiconductor device, and specifically, to a manufacturing method for a semiconductor module including a thin semiconductor stack structure.

BACKGROUND

Conventionally, in order to realize size reduction of electronic devices, a semiconductor module including a plurality of semiconductor chips have been manufactured. In order to increase the bandwidth and to decrease power consumption, the semiconductor chips built in such a semiconductor module are connected to each other by wire bonding conventionally used or by bump connection by use of convexed electrodes (bumps) formed on surfaces of the semiconductor chips (e.g., Japanese Patent No. 4809957).

Recently, semiconductor chips have been desired to be thinner in order to decrease the thickness of semiconductor devices or to facilitate formation of through-silicon vias (TSVs). Various methods for processing thin semiconductor wafers have been proposed (e.g., Japanese Laid-Open Patent Publication No. 2010-267653 and Japanese Laid-Open Patent Publication No. 2012-084780). However, manufacturing of a semiconductor module in which thin semiconductor chips are connected to each other by bump connection involves problems that, for example, chip cracks are caused by use of a BSG tape, dicing or pickup, or that bump connection faults are caused by the thin chips being curved at the time of bump connection. In the case where a wafer support is used for easier handling of a thin wafer, there occurs another problem that the cost is increased.

SUMMARY

The present invention has an object of providing a manufacturing method for a semiconductor device by which a semiconductor device that suppresses chip cracks and bump connection faults is manufactured at improved yield with improved reliability. The present invention also has an object of providing a manufacturing method for a semiconductor device which manufactures a semiconductor device at a wafer level with no use of a wafer support to decrease the manufacturing cost.

A manufacturing method for a semiconductor device in an embodiment according to the present invention includes: preparing a semiconductor wafer including an electrode formed therein, and electrically connecting a first semiconductor element formed in a semiconductor chip and the electrode formed in the semiconductor wafer to each other via a bump; before or after connecting the semiconductor wafer and the semiconductor chip to each other, filling a gap between the semiconductor wafer and the semiconductor chip, facing each other, with a first insulating resin layer; forming a second insulating resin layer on the semiconductor wafer to have a thickness sufficient to embed the semiconductor chip; grinding the second insulating resin layer and the semiconductor chip until a thickness of the semiconductor chip reaches a predetermined thickness; forming a first insulating layer on the second insulating resin layer and the semiconductor chip, and forming an opening in the first insulating layer and the second insulating resin layer to expose the electrode; filling the opening with a conductive material; forming a line on the first insulating layer, the line being connected with the conductive material filling the opening; forming a first terminal electrically connected with the line; and grinding the semiconductor wafer until a thickness of the semiconductor wafer reaches a predetermined thickness.

In an embodiment according to the present invention, the semiconductor wafer may include a plurality of device areas each including a second semiconductor element formed therein.

In an embodiment according to the present invention, a plurality of the semiconductor chips may be connected with each of the plurality of device areas.

In an embodiment according to the present invention, the grinding of the semiconductor wafer until the thickness of the semiconductor wafer reaches the predetermined thickness may be to grind the semiconductor wafer until the thickness of the semiconductor wafer reaches a finish thickness.

In an embodiment according to the present invention, the semiconductor wafer may include an embedded electrode having one of two ends thereof electrically connected with the second semiconductor element. The manufacturing method may further include: after forming the first terminal, grinding the semiconductor wafer to a position slightly before the other of the two ends of the embedded electrode; exposing the other end of the embedded electrode; and forming a second terminal electrically connected with the exposed other end of the embedded electrode.

In an embodiment according to the present invention, the manufacturing method for a semiconductor device may further include: before connecting the electrode and the first semiconductor element via the bump, forming a groove having a width greater than a dicing width in the semiconductor wafer, along a border between the plurality of device areas; and after grinding the semiconductor wafer until the thickness of the semiconductor wafer reaches the finish thickness, separating the semiconductor wafer into individual pieces. The separation of the semiconductor wafer into individual pieces may be to separate the semiconductor wafer along the groove formed in the semiconductor wafer, with the dicing width narrower than the width of the groove.

In an embodiment according to the present invention, the groove may have a depth greater than, or equal to, the finish thickness.

A manufacturing method for a semiconductor device in an embodiment according to the present invention includes: preparing a semiconductor wafer including an electrode formed therein, and preparing a first semiconductor chip including a first semiconductor element and a first embedded electrode formed therein, the first embedded electrode being electrically connected with the first semiconductor element; electrically connecting one of two ends of the first embedded electrode formed in the first semiconductor chip and the electrode formed in the semiconductor wafer to each other via a first bump; before or after connecting the semiconductor wafer and the first semiconductor chip to each other, filling a gap between the semiconductor wafer and the first semiconductor chip, facing each other, with a first insulating resin layer; forming a second insulating resin layer on the semiconductor wafer to have a thickness sufficient to embed the first semiconductor chip; grinding the second insulating resin layer and the first semiconductor chip to a position slightly before the other end of the first embedded electrode; exposing the other end of the first embedded electrode; forming a first insulating layer on the first semiconductor chip to cover the other end of the first embedded electrode; forming a terminal on the first insulating layer, the terminal being connected with the other end of the first embedded electrode via a contact hole; electrically connecting the terminal and a second semiconductor element formed in a second semiconductor chip to each other via a second bump; before or after connecting the terminal and the second semiconductor chip, filling a gap between the terminal/the first insulating layer and the second semiconductor chip, facing each other, with a third insulating resin layer; forming a fourth insulating resin layer on the first insulating layer to have a thickness sufficient to embed the second semiconductor chip; grinding the fourth insulating resin layer and the second semiconductor chip until a thickness of the second semiconductor chip reaches a predetermined thickness; forming a second insulating layer on the fourth insulating resin layer and the second semiconductor chip; forming an opening in the second insulating layer, the fourth insulating resin layer, the first insulating layer and the second insulating resin layer to expose the electrode formed in the semiconductor wafer; filling the opening with a conductive material; forming a line on the second insulating layer, the line being connected with the conductive material filling the opening; forming a first terminal electrically connected with the line; and grinding the semiconductor wafer until a thickness of the semiconductor wafer reaches a predetermined thickness.

In an embodiment according to the present invention, the semiconductor wafer may include a plurality of device areas each including a third semiconductor element formed therein.

In an embodiment according to the present invention, a plurality of the first semiconductor chips may be connected with each of the plurality of device areas.

In an embodiment according to the present invention, the manufacturing method for a semiconductor device may further include electrically connecting the electrode formed in each of the device areas of the semiconductor wafer and a fourth semiconductor element formed in at least one third semiconductor chip to each other via the first bump.

In an embodiment according to the present invention, the grinding of the semiconductor wafer until the thickness of the semiconductor wafer reaches the predetermined thickness may be to grind the semiconductor wafer until the thickness of the semiconductor wafer reaches a finish thickness.

In an embodiment according to the present invention, the semiconductor wafer may include a second embedded electrode having one of two ends thereof electrically connected with the third semiconductor element, The manufacturing method may further include: after forming the first terminal, grinding the semiconductor wafer to a position slightly before the other of the two ends of the second embedded electrode; exposing the other end of the second embedded electrode; and forming a second terminal electrically connected with the exposed other end of the second embedded electrode.

In an embodiment according to the present invention, the manufacturing method for a semiconductor device may further include: before connecting the electrode and the first embedded electrode by a bump, forming a groove having a width greater than a dicing width in the semiconductor wafer, along a border between the plurality of device areas; and after grinding the semiconductor wafer until the thickness of the semiconductor wafer reaches the finish thickness, separating the semiconductor wafer into individual pieces; wherein the separation of the semiconductor wafer into individual pieces is to separate the semiconductor wafer along the groove formed in the semiconductor wafer, with the dicing width narrower than the width of the groove.

In an embodiment according to the present invention, the groove may have a depth greater than, or equal to, the finish thickness.

The present invention provides a manufacturing method for a semiconductor device by which a semiconductor device that suppresses chip cracks and bump connection faults is manufactured at improved yield with improved reliability. The present invention also provides a manufacturing method for a semiconductor device which decreases the manufacturing cost.

DESCRIPTION OF EMBODIMENTS

Hereinafter, a manufacturing method for a semiconductor device according to the present invention will be described with reference to the drawings. The manufacturing method for a semiconductor device according to the present invention may be carried out in many different embodiments, and is not to be construed as being limited to the following embodiments. In the figures referred to in the following embodiments, the same components or components having substantially the same functions will bear the same reference signs, and the descriptions thereof will not be repeated. In the following description, in the case where a layer, a film, an area or any other component is expressed as being "on" another component, such an expression is not limited to indicating that the component is "directly on" the another component and may be used for a case where still another component is provided between these two components.

First Embodiment

An overview of a manufacturing method for a semiconductor device in a first embodiment according to the present invention will be described with reference to FIG. 1 through FIG. 8.

Figure 1A:
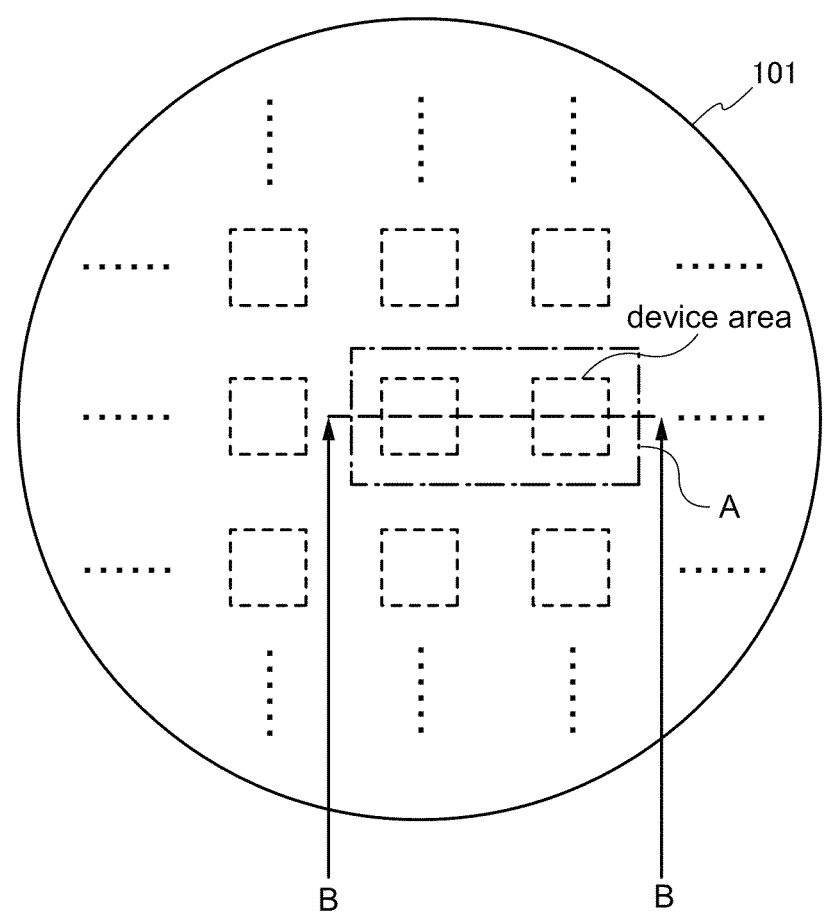
FIG. 1A shows a manufacturing method for a semiconductor device in a first embodiment according to the present invention.
Figure 1B:
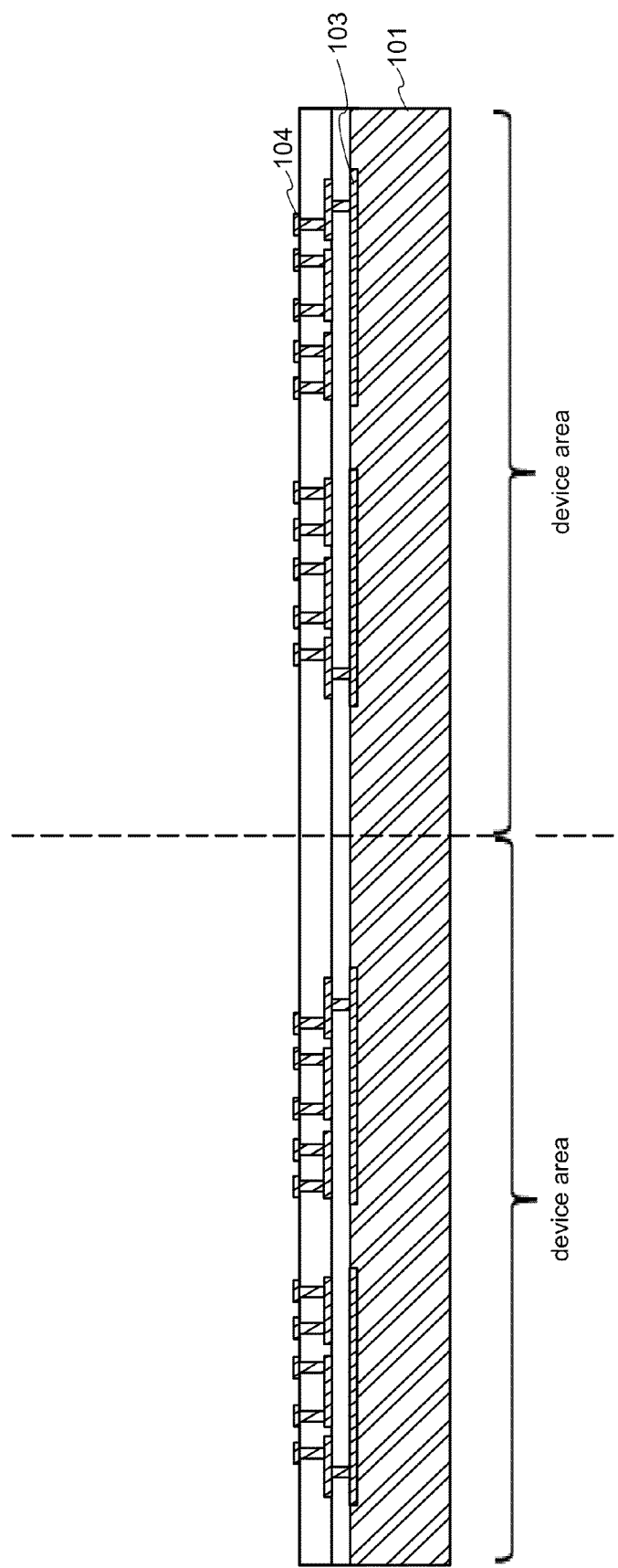
FIG. 1B shows the manufacturing method for a semiconductor device in the first embodiment according to the present invention.

As shown in FIG. 1A and FIG. 1B, a semiconductor wafer 101 having a plurality of device areas formed therein is prepared. The "device area" is an area which acts as one semiconductor chip after the semiconductor wafer is diced into individual pieces. FIG. 1A is a plan view of the semiconductor wafer 101, and FIG. 1B is a cross-sectional view of area A shown in FIG. 1A taken along line B-B in FIG. 1A. The semiconductor wafer 101 may have a semiconductor element (hereinafter, referred to as a "first semiconductor element") 103 in each of the device areas. The first semiconductor element 103 may include a device such as a transistor or the like. On the semiconductor wafer 101, an electrode 104 electrically connected with the first semiconductor element 103 and formed of a metal material such as Al or the like is provided in each device area, with an insulating film being provided between the semiconductor wafer 101 and the electrode 104. On the semiconductor wafer 101, a line layer that connects the first semiconductor element 103 and the electrode 104 to each other may be provided. FIG. 1B is a partial cross-sectional view of the semiconductor wafer 101, and shows two device areas formed in the semiconductor wafer 101. The semiconductor wafer 101 may be an interposer substrate, which does not have the semiconductor element 103 and has a line layer formed therein. The following description will be given regarding one device area unless otherwise specified.

Next, semiconductor chips 105 each having a second semiconductor element (hereinafter, referred to as a "second semiconductor element") 106 formed in a semiconductor substrate are prepared. The second semiconductor element 106 includes a device such as a transistor or the like. Since the semiconductor device is assembled together on a wafer level, the semiconductor chips 105 are prepared in a number equal to the number of the device areas formed in the semiconductor wafer 101. On each of the semiconductor chips 105, an electrode 107 electrically connected with the second semiconductor element 106 via a line is provided, with an insulating layer being provided between the semiconductor chip 105 and the electrode 107.

Figure 2A:
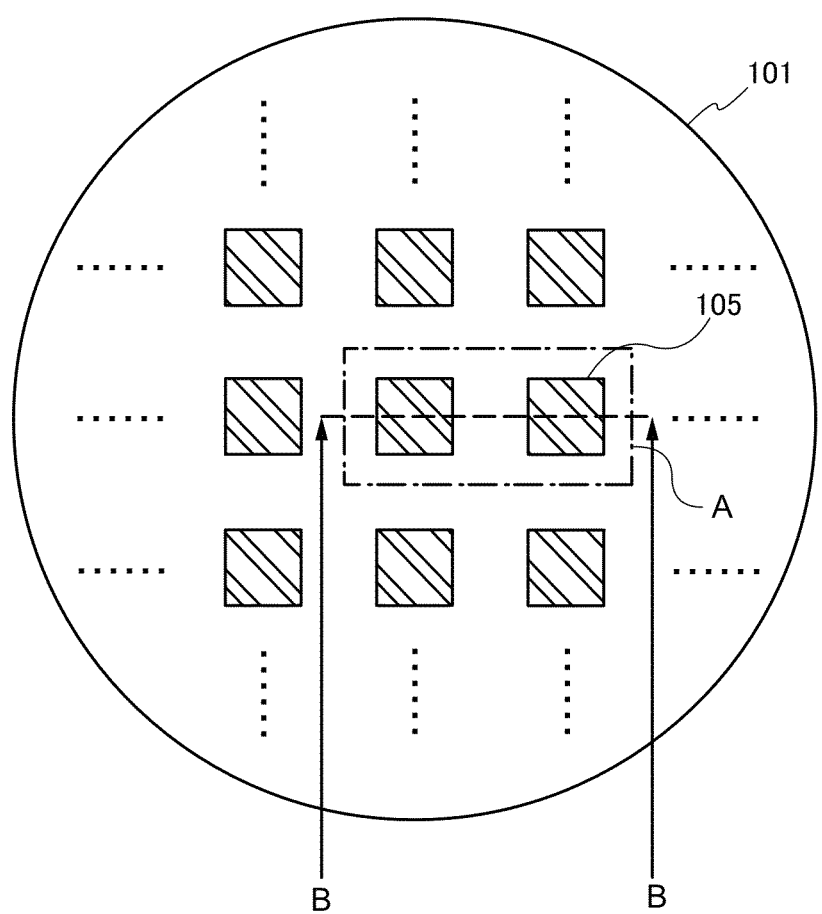
FIG. 2A shows the manufacturing method for a semiconductor device in the first embodiment according to the present invention.
Figure 2B:
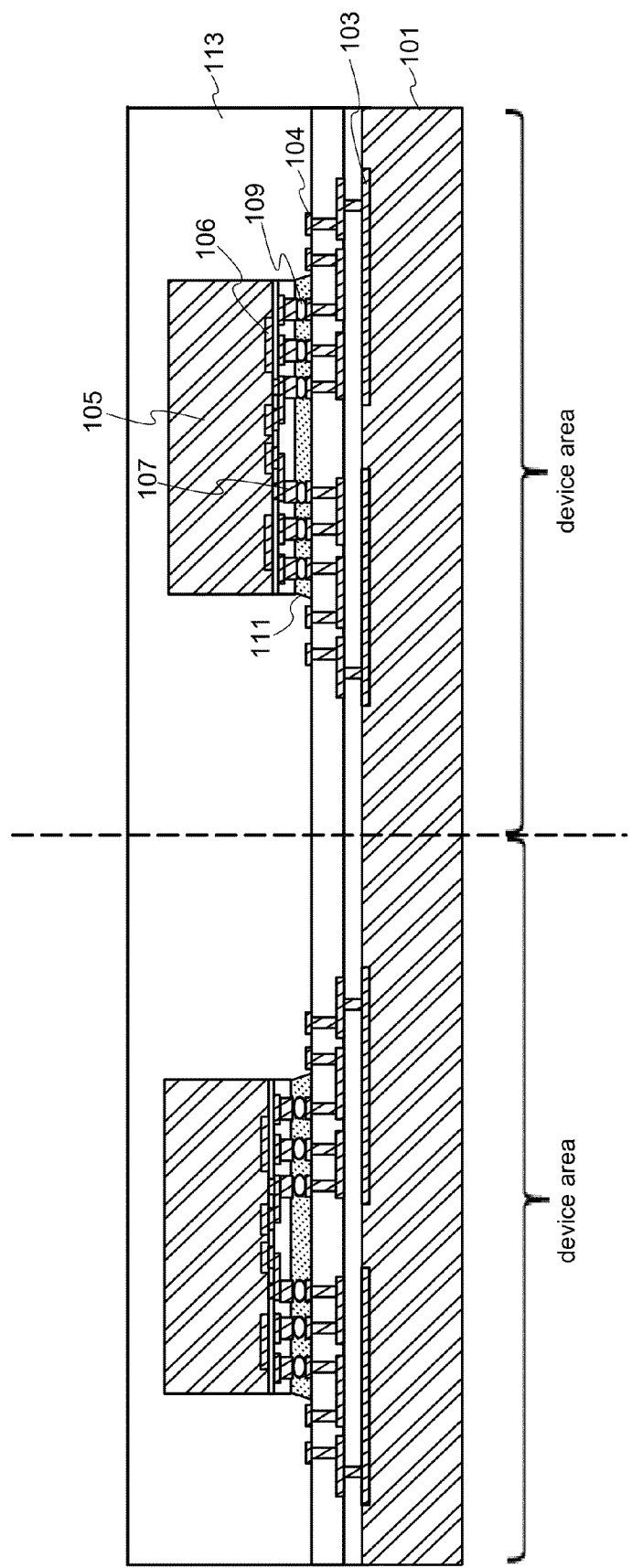
FIG. 2B shows the manufacturing method for a semiconductor device in the first embodiment according to the present invention.

As shown in FIG. 2A and FIG. 2B, the first semiconductor element 103 formed in each of the device areas of the semiconductor wafer 101, and the second semiconductor element 106 formed in the semiconductor chip 105, are located to face each other and electrically connected to each other via a bump 109. FIG. 2A is a plan view showing a state where the semiconductor chips 105 are located on, and joined with, the semiconductor wafer 101 by bump connection. FIG. 2B is a cross-sectional view of area A shown in FIG. 2A taken long line B-B in FIG. 2A. Specifically, the bump 109 is formed on the electrode 104 electrically connected with the first semiconductor element 103 and facing the semiconductor chip 105 and/or the electrode 107 electrically connected with the second semiconductor element 106, and the electrode 104 and the electrode 107 are located to face each other and joined together by heat treatment. The bump 109 may be formed of, for example, a gold, solder or copper pillar by a semi-additive process or the like. In FIG. 2B, the bump 109 is formed on only the electrode 104 and/or the electrode 107 used to connect the first semiconductor element 103 and the second semiconductor element 106. The present invention is not limited to this, and the bump 109 may also be formed on another electrode 104 that does not face the semiconductor chip 105. In the case where the semiconductor wafer 101 is an interposer substrate, an electrode formed on the interposer substrate and electrically connected with a line formed in the interposer substrate, and the electrode 107 electrically connected with the second semiconductor element 106, may be connected to each other by bump connection.

As shown in FIG. 2B, after the semiconductor wafer 101 and the semiconductor chip 105 are joined together by bump connection, a gap between the semiconductor wafer 101 and the semiconductor chip 105 is filled with an underfill (hereinafter, referred to as a "first insulating resin layer") 111. The first insulating resin layer 111 may be formed of any insulating resin usable for an underfill with no specific limitation, for example, a combination of an epoxy-based resin, a filler such as silica or alumina and an amine-based curing agent. The first insulating resin layer 111 may be formed before the semiconductor wafer 101 and the semiconductor chip 105 are joined together by bump connection.

An example of method for filling the gap between the semiconductor wafer 101 and the semiconductor chip 105 with the underfill to realize capillary underfill (CUF) after the semiconductor wafer 101 and the semiconductor chip 105 are joined together via the bump 109 will be described below.

After the semiconductor wafer 101 and the semiconductor chip 105 are joined together by bump connection, the semiconductor wafer 101 and the semiconductor chip 105 may be subjected to a plasma treatment process when necessary in order to raise the fluidity of the underfill, and then a liquid underfill material may be applied to the semiconductor wafer 101 by use of a dispenser or the like in the shape of a line at a position that is, for example, about several hundred micrometers away from one side of the semiconductor chip 105. In the case where the dispenser is used, the semiconductor chip 105 and the underfill material may be heated in order to decrease the viscosity of the liquid underfill material, and the application may be performed a plurality of times at a specified time interval. The applied underfill material enters the gap between the semiconductor wafer 101 and the semiconductor chip 105 by capillary action.

An example of method for filling the gap between the semiconductor wafer 101 and the semiconductor chip 105 with a liquid underfill material (NCP: non-conductive paste) before the semiconductor wafer 101 and the semiconductor chip 105 are joined together with the bump 109 will be described.

Before the semiconductor wafer 101 and the semiconductor chip 105 are joined together by bump connection, a dispenser or the like is mounted on, for example, a bump connection device (flip chip bonder). The underfill material is applied on the semiconductor wafer 101, in a part or the entirety of an area where the semiconductor 105 is to be mounted. The application is performed on a track with which a void is not easily formed. At the same time as when the semiconductor chip 105 is mounted on the semiconductor wafer 101, namely, when the semiconductor wafer 101 and the semiconductor chip 105 are connected to each other by bump connection, the underfill material may be expanded to the entirety of the gap between the semiconductor wafer 101 and the semiconductor chip 105.

Alternatively, a liquid underfill material may be applied by spin coating, or a film-like underfill material may be applied by lamination or the like, to one of, or both of, the semiconductor wafer 101 and the semiconductor chip 105 on a wafer-by-wafer basis before dicing. In this case, the semiconductor wafer 101 provided with the underfill material and the semiconductor chip 105 after dicing may be connected to each other by bump connection, and at the same time, the gap therebetween may be filled with the underfill material.

The gap between the semiconductor wafer 101 and the semiconductor chip 105 is filled with the underfill material by, for example, any of the above-described methods. Then, the underfill material is heated by an oven or the like to be cured. Thus, the first insulating resin layer 111 is formed.

Next, as shown in FIG. 2B, an insulating resin layer (hereinafter, referred to as a "second insulating resin layer") 113 is formed on the semiconductor wafer 101 to have a thickness that is sufficient to embed the semiconductor chip 105. There is no specific limitation on the material of the second insulating resin layer 113. The second insulating resin layer 113 needs to have a resistance against a chemical used in a re-wiring step and a heat resistance against soldering. A resin having a low thermal expansion coefficient is desirable as a material of the second insulating resin layer 113 to suppress the wafer from being curved. For example, a film mold material formed of an epoxy hybrid material for compression molding that is used to embed a fan-out package chip or formed of a silicon hybrid material for vacuum lamination may be used. FIG. 2A does not show the second insulating resin layer 113.

Figure 3:
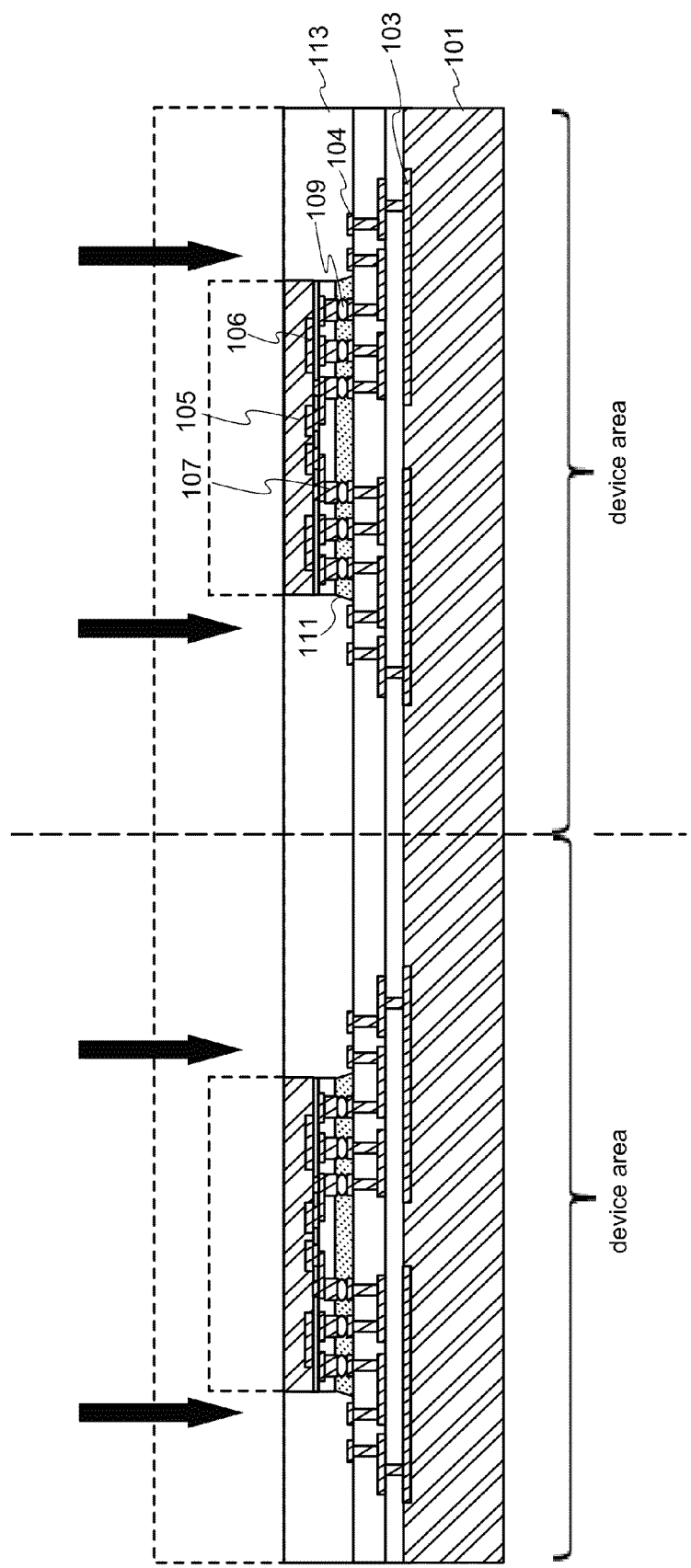
FIG. 3 shows the manufacturing method for a semiconductor device in the first embodiment according to the present invention.

Next, after the second insulating resin layer 113 is cured, as shown in FIG. 3, the semiconductor chip 105 is ground by back grinding from a rear surface thereof in which the second semiconductor element 106 is not provided, together with the second insulating resin layer 113, until the thickness of the semiconductor chip 105 reaches a desired thickness (finish thickness, namely, the final thickness of the semiconductor chip 105 after a thinning step). The semiconductor chip 105 and the second insulating resin layer 113 are ground as follows. A BSG (Back Side Grinding) tape (surface protection tape) is bonded to a rear surface of the semiconductor wafer 101 in which the first semiconductor element 103 is not provided, and the semiconductor chip 105 is thinned by a back grinding step. After the thinning of the semiconductor chip 105 is finished, the BSG tape is peeled off from the rear surface of the semiconductor wafer 101.

Figure 4:
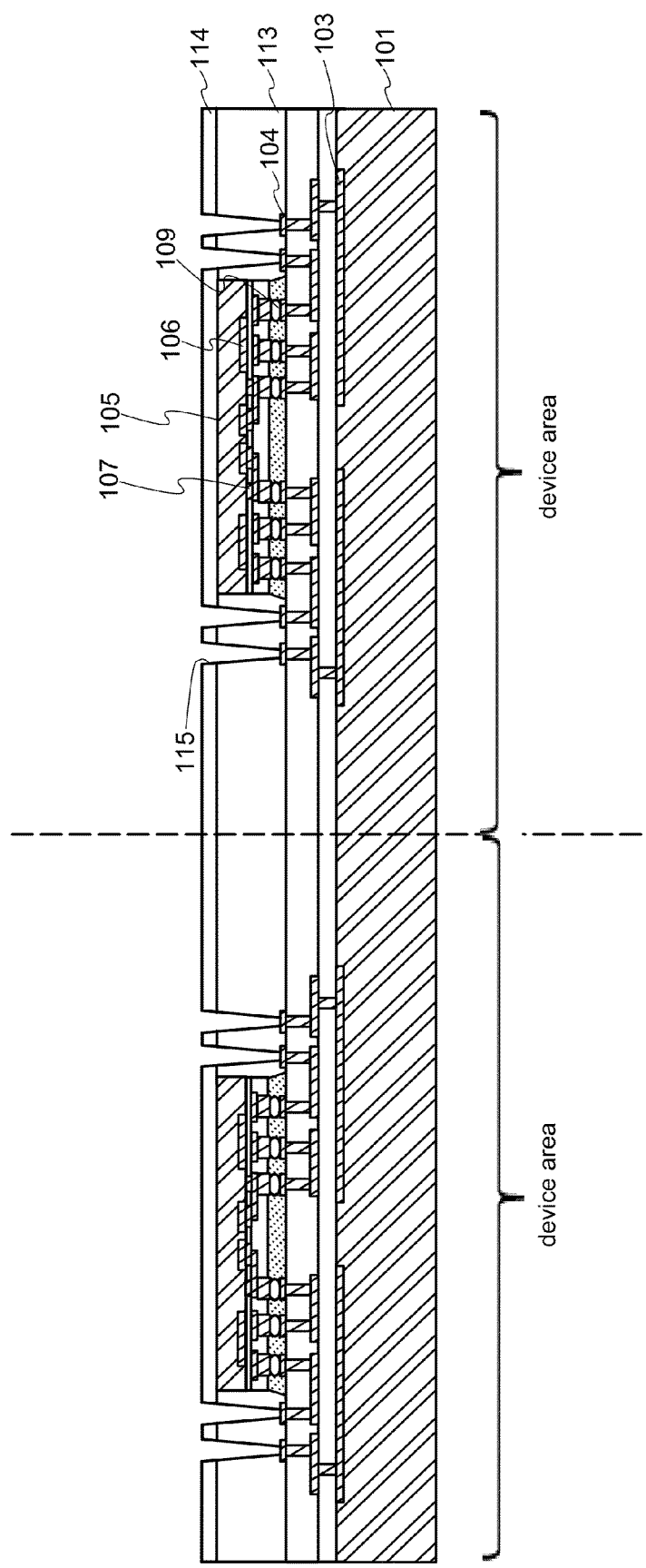
FIG. 4 shows the manufacturing method for a semiconductor device in the first embodiment according to the present invention.

Next, before a line is formed on the rear surface of the semiconductor chip 105, a first insulating layer 114 is formed as shown in FIG. 4. The first insulating layer 114 is formed on the ground surface of the semiconductor chip 105 and the second insulating resin layer 113. The first insulating layer 114 may be formed by, for example, applying an epoxy-based resin coating material for a build-up wiring board. Alternatively, the first insulating layer 114 may be formed of a film-type interlayer insulating material, which is easy to handle, or formed of a resin-attached copper foil or the like that assists a line formation step described below. Then, as shown in FIG. 4, the second insulating resin layer 113 and the first insulating layer 114 are irradiated with $CO_2$ laser light or UV-YAG laser light to form an opening 115 to expose the electrode 104 formed on the semiconductor wafer 101 and not facing the semiconductor chip 105. The opening 115 is preferably formed by laser light from the point of view of cost, but may be formed by photo-etching. The intensity of the laser light used to form the opening 115 is set such that the electrode 104 on the semiconductor wafer 101 is not processed. In the case where the electrode 104 not facing the semiconductor chip 105 may possibly be damaged by the laser light, the bump 109 of, for example, a copper pillar or the like as described above is formed on the electrode 104 to protect the electrode 104 against the laser light. Thus, the electrode 104 is prevented from being damaged. In the case where $CO_2$ laser light is used, resin smear occurs. Therefore, soon after the opening 115 is formed, a desmear process is performed. In the case where the electrode 104 is protected by the copper pillar or the like, the desmear process may be performed by use of a desmear liquid formed of alkaline permanganate. In the case where the electrode 104 is exposed, the desmear process may be performed by plasma desmear or the like.

Figure 5:
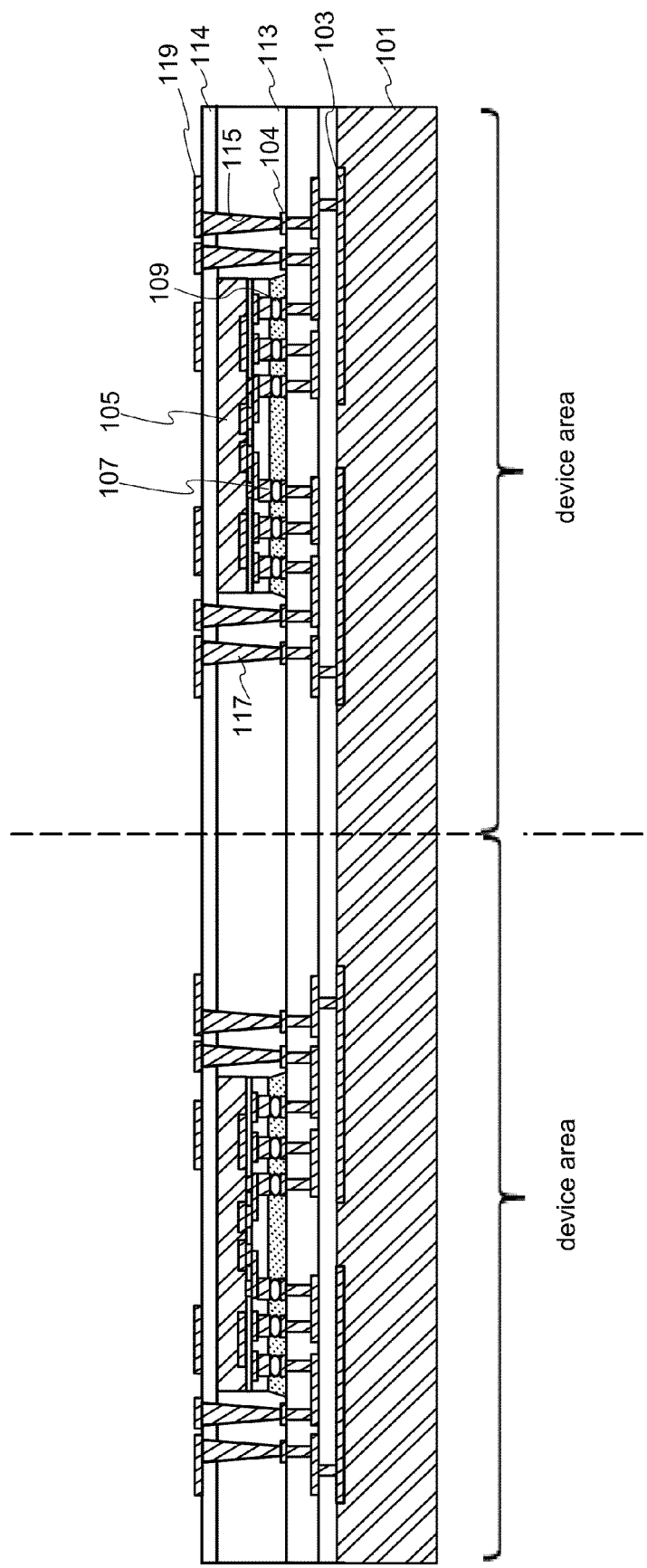
FIG. 5 shows the manufacturing method for a semiconductor device in the first embodiment according to the present invention.

Next, as shown in FIG. 5, a conductive layer is formed on the first insulating layer 114, on the electrode 104 exposed by the opening 115 and on a side surface of the opening 115. The conductive layer is patterned to form a line 117 filling the opening 115 and a line 119 connected with the line 117. The lines 117 and 119 may be formed by, for example, a semi-additive process or the like. In the case where the semi-additive process is used, the lines 117 and 119 may be formed as follows. A plated layer is formed on the first insulating layer 114, on the electrode 104 exposed by the opening 115 and on a side surface of the opening 115 by electroless copper plating, and a plating resist pattern is formed on the plated layer. A line is formed of electroless copper plating based on the pattern, and then the plating resist is removed. An exposed portion of the electroless copper is removed by etching. As a result of these steps, the line 117 filling the opening 115 and the line 119 connected with the line 117 are formed. Two or more layers of lines may be formed by repeating the insulation layer formation step and the line formation step.

Figure 6:
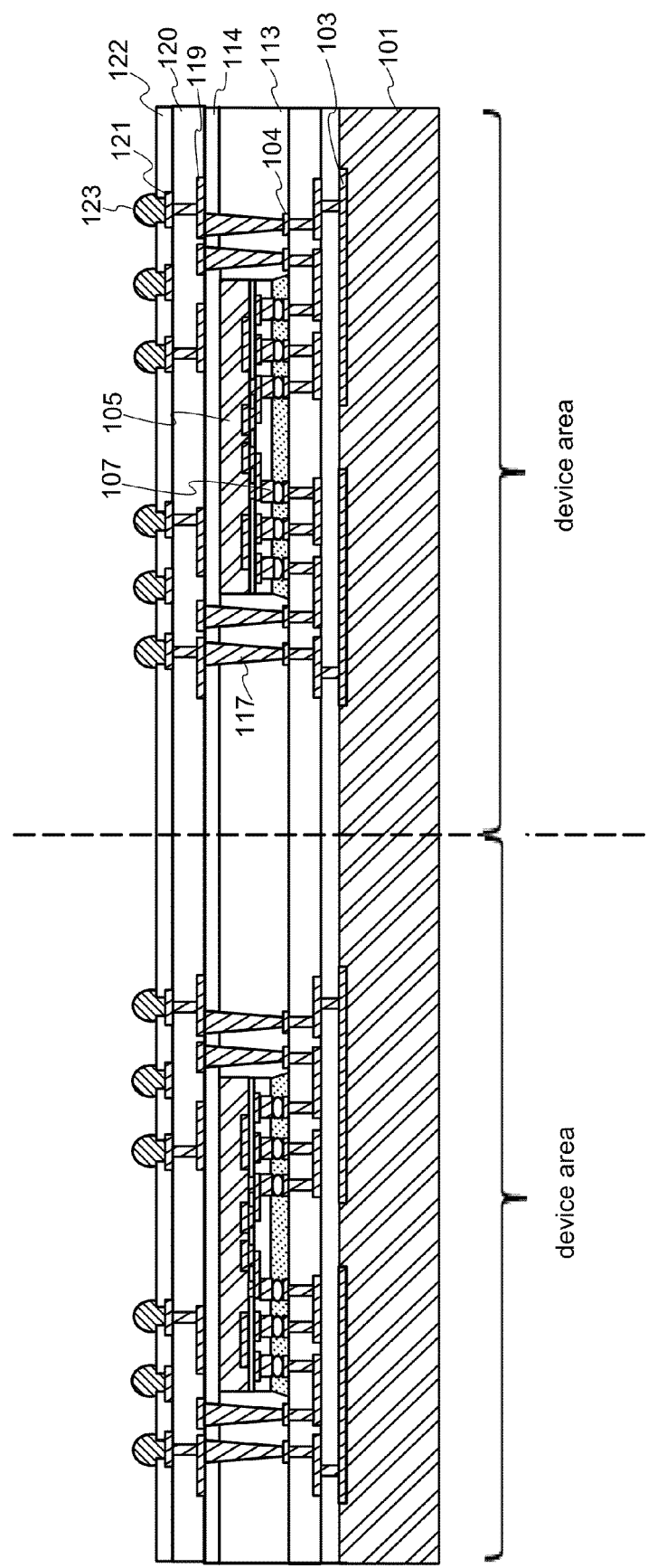
FIG. 6 shows the manufacturing method for a semiconductor device in the first embodiment according to the present invention.

After the lines 117 and 119 are formed, as shown in FIG. 6, an insulating film 120 is formed on the line 119, and then a terminal 121 is formed on the insulating film 120, the terminal 121 being connected with the line 119. The insulating film 120 may be formed of a thermosetting epoxy-based insulating film for a build-up wiring board or a resin-attached copper foil, like the first insulating layer 114. A solder resist 122 is applied on the terminal 121, and an opening is formed in the solder resist 122 to expose the terminal 121. An exposed surface of the terminal 121 may be subjected to an anti-oxidation process such as an organic solderability preservative (OSP) process or the like. On the terminal 121, an external terminal 123 may be formed when necessary in each device area at a wafer level. The external terminal 123 may be formed of solder balls mounted by a ball mounting device, so that a BGA (Ball Grid Array) is formed.

Figure 7:
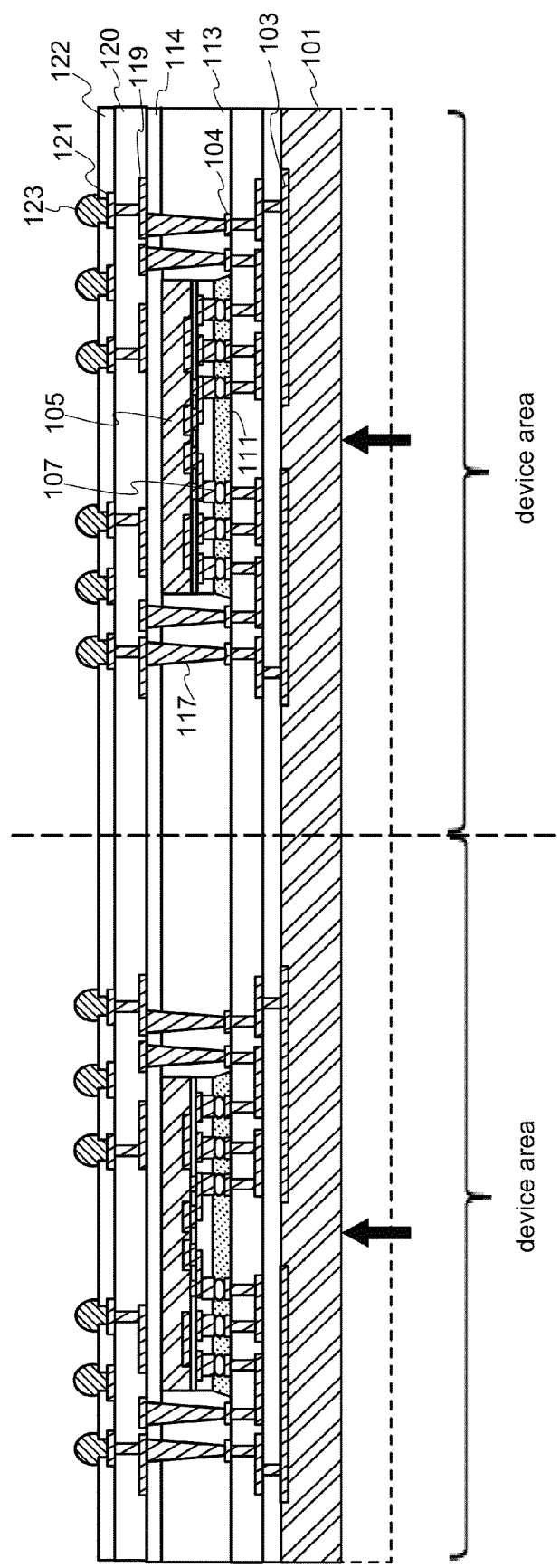
FIG. 7 shows the manufacturing method for a semiconductor device in the first embodiment according to the present invention.

Next, as shown in FIG. 7, the semiconductor wafer 101 is ground by back grinding from the rear surface thereof in which the first semiconductor element 103 is not provided, until the thickness of the semiconductor wafer 101 reaches a desired thickness (finish thickness, namely, the final thickness of the semiconductor wafer 101 after the thinning step). Thus, the semiconductor wafer 101 is thinned. Before the semiconductor wafer 101 is ground, a BSG tape is bonded to a surface at which the terminal 121 or the external terminal 123 is formed. After the thinning of the semiconductor wafer 101 is finished, the BSG tape is peeled off.

Figure 8:
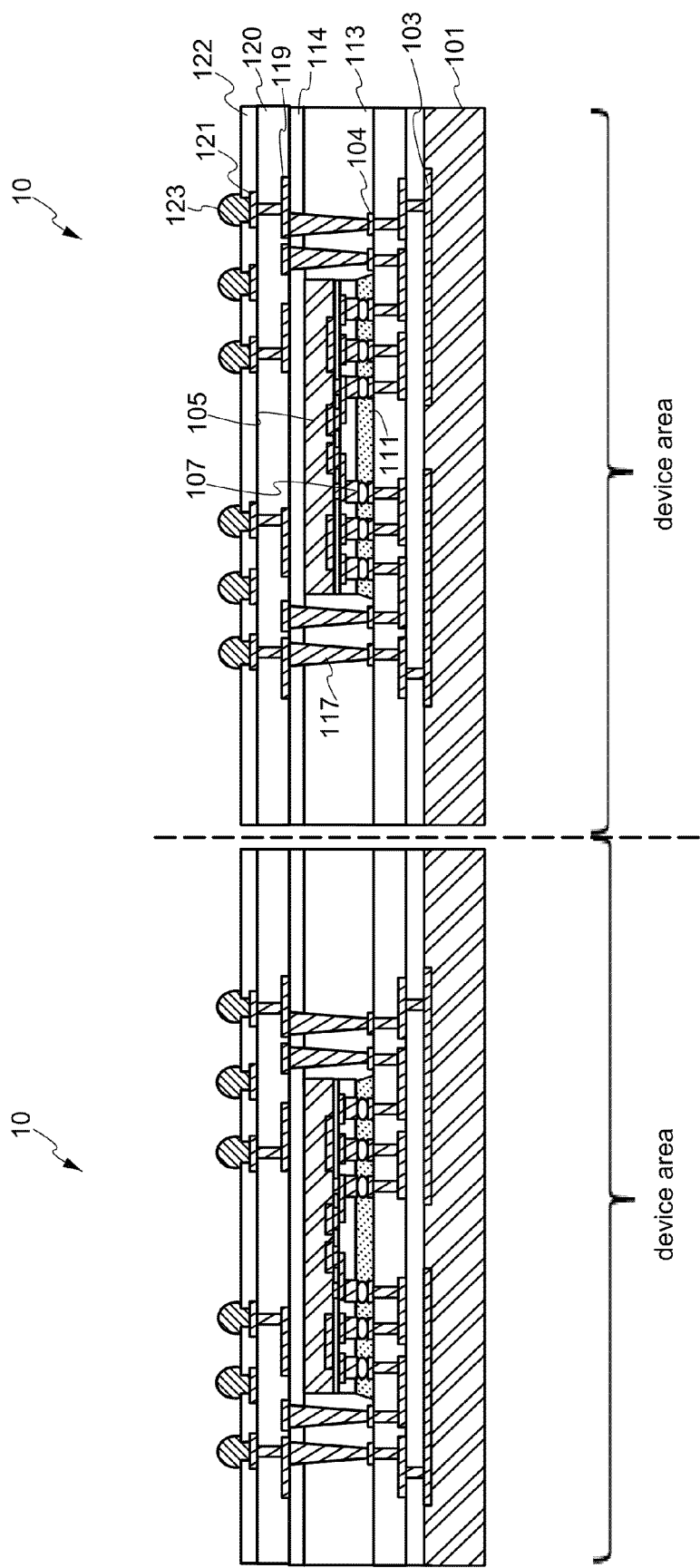
FIG. 8 shows the manufacturing method for a semiconductor device in the first embodiment according to the present invention.

Then, as shown in FIG. 8, the semiconductor wafer 101 is diced together with the solder resist 122, the insulating film 120, the first insulating layer 114 and the second insulating resin layer 113, along a border between the device areas formed in the semiconductor wafer 101 into individual pieces. As a result, a semiconductor device 10 is provided. Before the semiconductor wafer 101 is diced into individual pieces, an insulating film formed of an insulating resin or the like may be formed on the rear surface of the semiconductor wafer 101 and cured when necessary. In the case where the insulating film is formed on the rear surface of the semiconductor wafer 101, the insulating film is diced into individual pieces together with the semiconductor wafer 101.

With the manufacturing method for a semiconductor device in embodiment 1 according to the present invention, the semiconductor wafer 101 and the semiconductor chip 105 are connected by bump connection before being thinned (in the state where the semiconductor wafer 101 and the semiconductor chip 105 are thick). Therefore, bump connection faults or shortcircuiting is suppressed from occurring due to the chip being curved at the time of bump connection, and thus the yield and the reliability of the semiconductor devices are improved. In addition, the semiconductor chip 105 is ground after being reinforced by the second insulating resin layer 113. Therefore, chip cracks are suppressed from occurring while the semiconductor 105 is ground. Before the semiconductor wafer 101 is thinned (while the semiconductor 101 is still thick), the line 119 is formed. Therefore, the line 119 is formed stably owing to the rigidity of the semiconductor wafer 101 with no use of a wafer support. This decreases the manufacturing cost.

Second Embodiment

An overview of a manufacturing method for a semiconductor device in a second embodiment according to the present invention will be described with reference to FIG. 9 through FIG. 14. Unlike the manufacturing method for a semiconductor device in the first embodiment, the manufacturing method for a semiconductor device in the second embodiment includes the step of forming a groove in the surface of the semiconductor wafer along the border between the plurality of device areas formed in the semiconductor wafer. The groove has a width greater than a dicing width. This step is performed before the first semiconductor element formed in each of the device areas and the second semiconductor element formed in the semiconductor chip are located to face each other and are joined together via the bump. In the following description of the manufacturing method for a semiconductor device in the second embodiment, the same steps or processes as those of the manufacturing method for a semiconductor device in the first embodiment will be omitted or simplified.

Figure 9A:
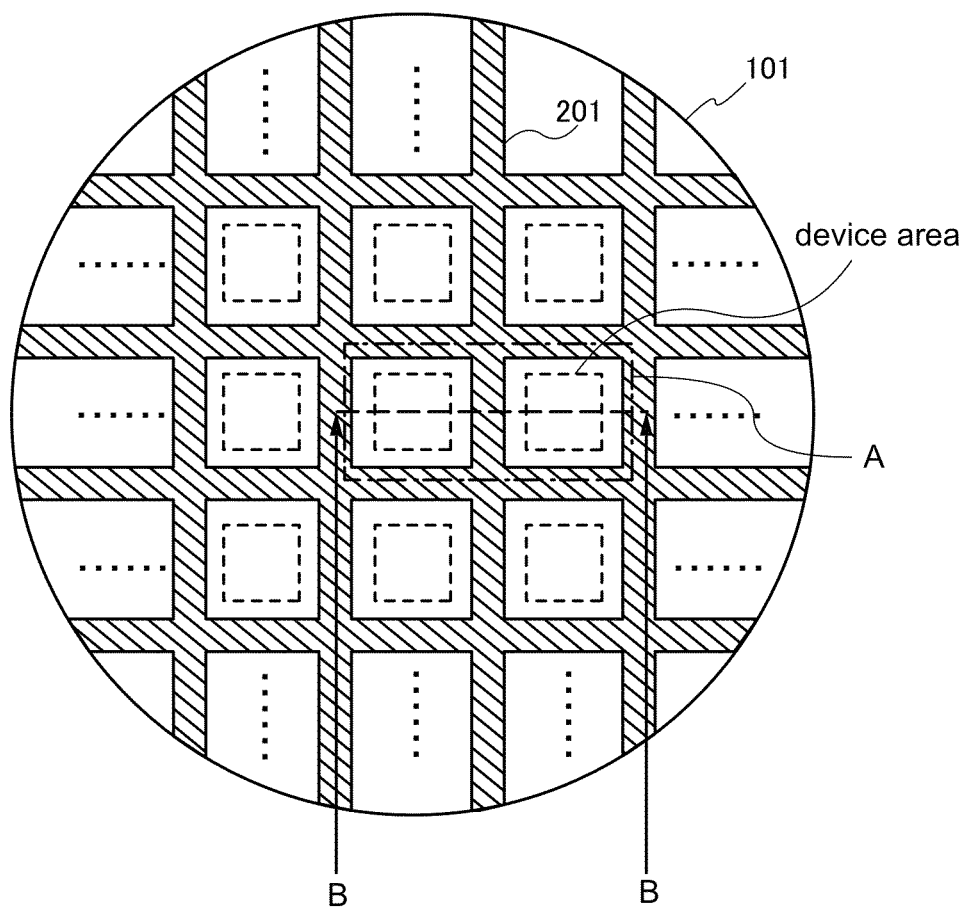
FIG. 9A shows a manufacturing method for a semiconductor device in a second embodiment according to the present invention.
Figure 9B:
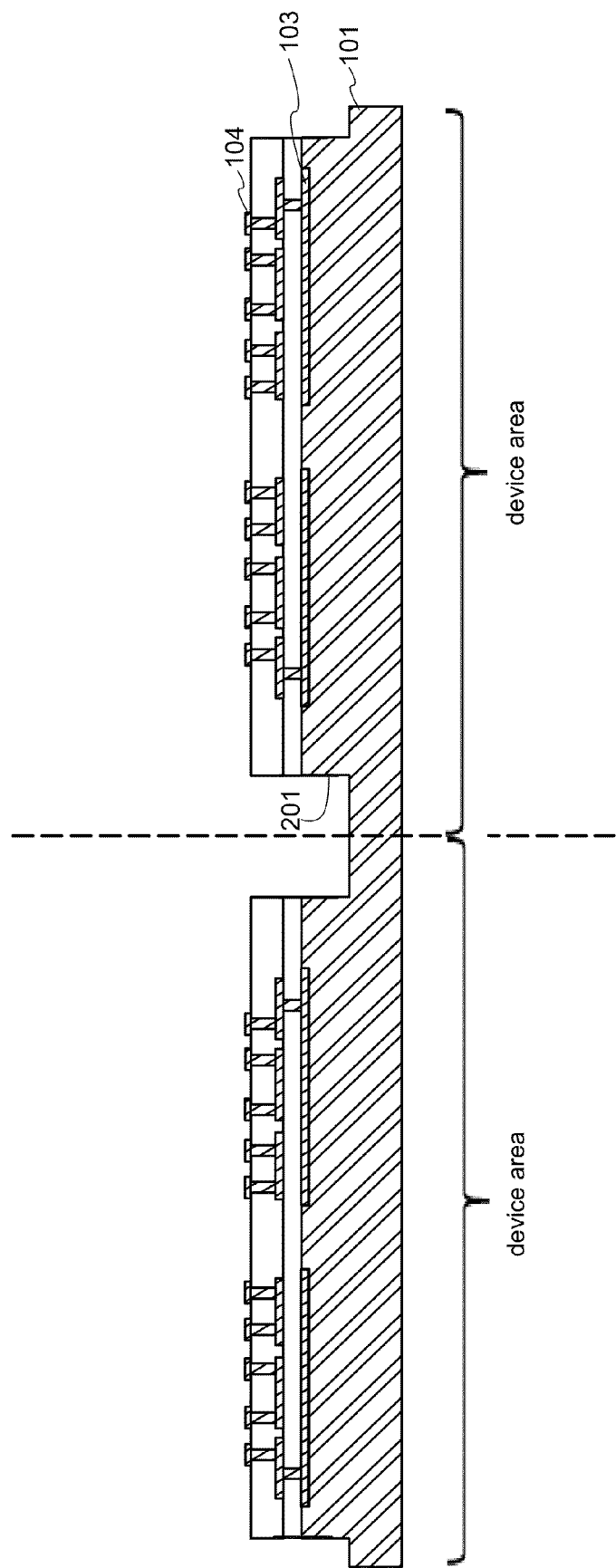
FIG. 9B shows the manufacturing method for a semiconductor device in the second embodiment according to the present invention.

FIG. 9A is a plan view of a semiconductor wafer 101, and FIG. 9B is a cross-sectional view of area A shown in FIG. 9A taken along line B-B in FIG. 9A. First, as in the first embodiment, a semiconductor wafer 101 having a plurality of device areas formed therein is prepared. As shown in FIG. 9A and FIG. 9B, a groove 201 having a width greater than the dicing width is formed in a surface of the semiconductor wafer 101 in which a first semiconductor element 103 is provided, along a border between the device areas. The groove 201 may be formed by half dicing by use of a blade, laser light or the like. The groove 201 is formed to have a depth that is greater than, or equal to, a finish thickness of the semiconductor wafer 101. The semiconductor wafer 101 may be an interposer substrate, which does not have the semiconductor element 103 and has a line layer formed therein.

Figure 10:
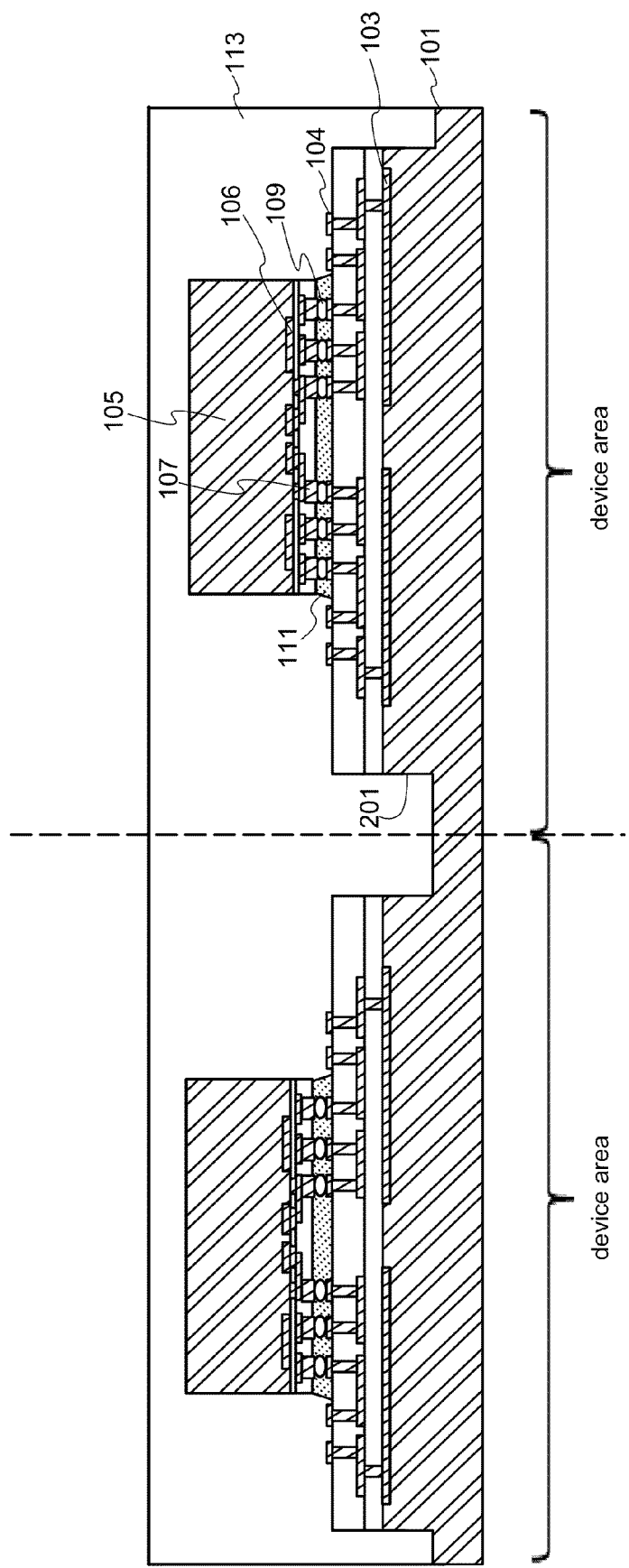
FIG. 10 shows the manufacturing method for a semiconductor device in the second embodiment according to the present invention.

The manufacturing method for a semiconductor device in the second embodiment according to the present invention is substantially the same as the manufacturing method for a semiconductor device in the first embodiment, except that the groove 201 is formed in the semiconductor wafer 101 along the border between the device areas. Specifically, as shown in FIG. 10, the semiconductor wafer 101 and a semiconductor chip 105 are joined together by bump connection at a wafer level, a gap between the semiconductor wafer 101 and the semiconductor chip 105 is filled with a first insulating resin layer 111, and a second insulating resin layer 113 is formed on the semiconductor wafer 101 to have a thickness that is sufficient to embed the semiconductor chip 105. The second insulating resin layer 113 is also used to fill the groove 201 formed in the semiconductor wafer 101.

Figure 11:
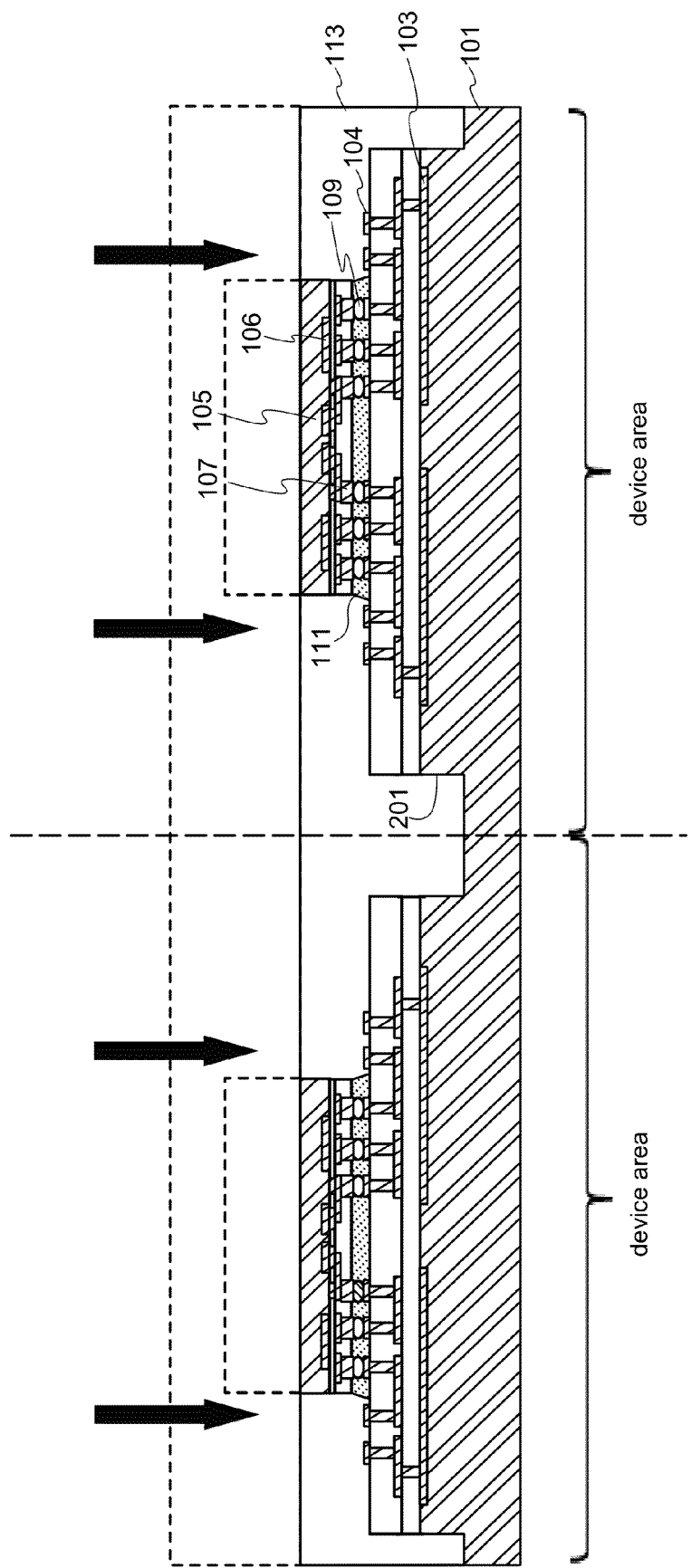
FIG. 11 shows the manufacturing method for a semiconductor device in the second embodiment according to the present invention.

Then, as shown in FIG. 11, the semiconductor chip 105 is ground by back grinding from a rear surface thereof, together with the second insulating resin layer 113, until the thickness of the semiconductor chip 105 reaches a finish thickness of the semiconductor chip 105. Thus, the semiconductor chip 105 is thinned. Next, as shown in FIG. 12, a first insulating layer 114 is formed on the ground surface of the semiconductor chip 105 and the second insulating resin layer 113.

Figure 12:
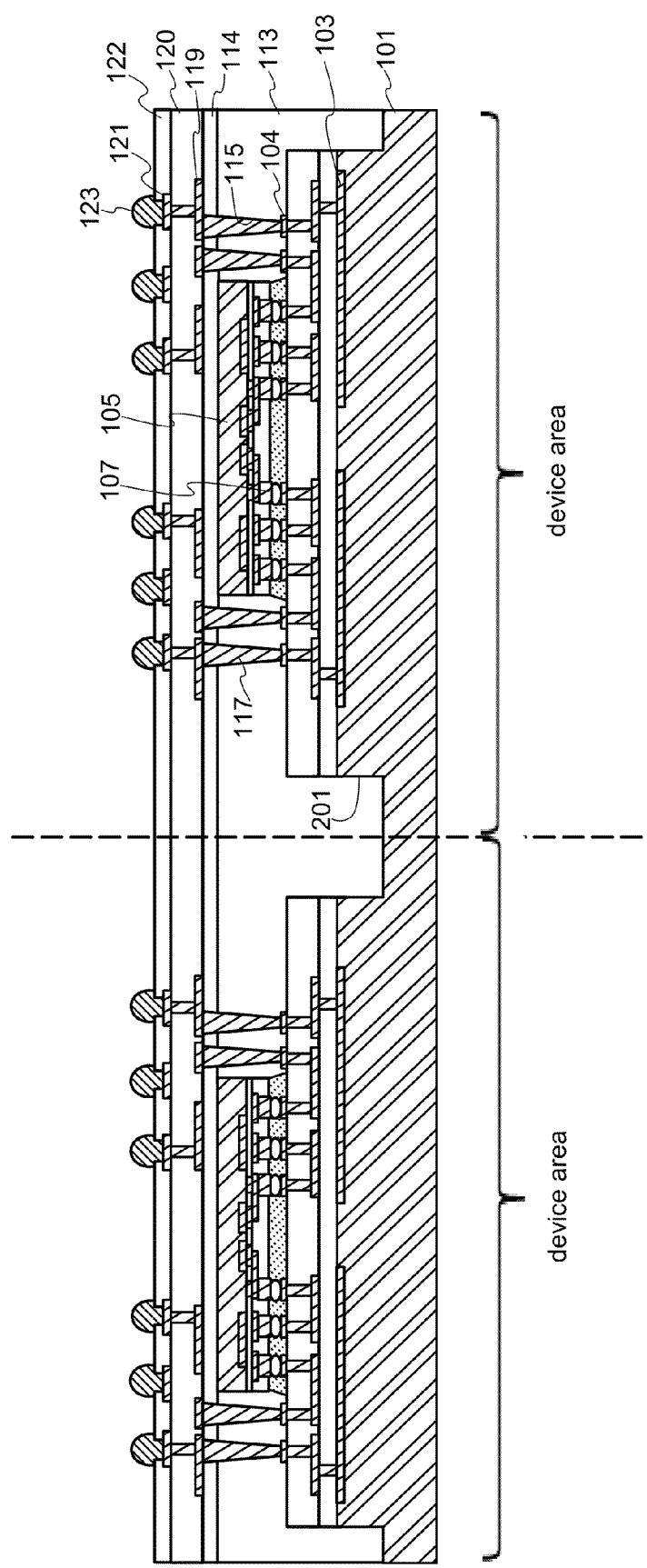
FIG. 12 shows the manufacturing method for a semiconductor device in the second embodiment according to the present invention.

Then, as shown in FIG. 12, the second insulating resin layer 113 and the first insulating layer 114 are irradiated with $CO_2$ laser light, UV-YAG laser light or the like to form an opening 115 to expose the electrode 104 formed on the semiconductor wafer 101. Next, a conductive layer is formed by a semi-additive process or the like on the first insulating layer 114, on the electrode 104 exposed by the opening 115 and on a side surface of the opening 115. The conductive layer is patterned to form a line 117 filling the opening 115 and a line 119 connected with the line 117. After the lines 117 and 119 are formed, an insulating film 120 is formed on the line 119, and then a terminal 121 is formed on the insulating film 120, the terminal 121 being connected with the line 119. A solder resist 122 is applied on the terminal 121, and an opening is formed in the solder resist 122 to expose the terminal 121. An exposed surface of the terminal 121 may be subjected to an anti-oxidation process such as an OSP process or the like. On the terminal 121, an external terminal 123 may be formed when necessary in each device area at a wafer level.

Figure 13:
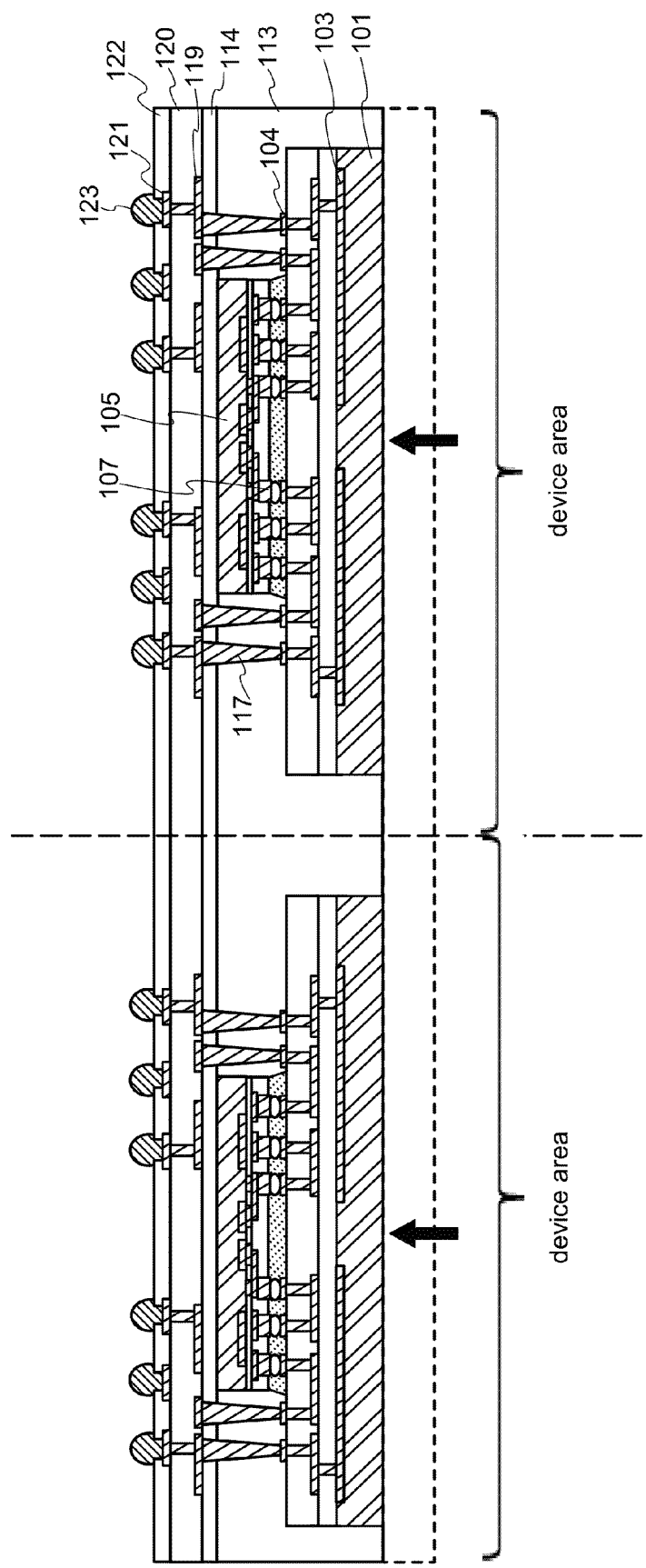
FIG. 13 shows the manufacturing method for a semiconductor device in the second embodiment according to the present invention.
Figure 14:
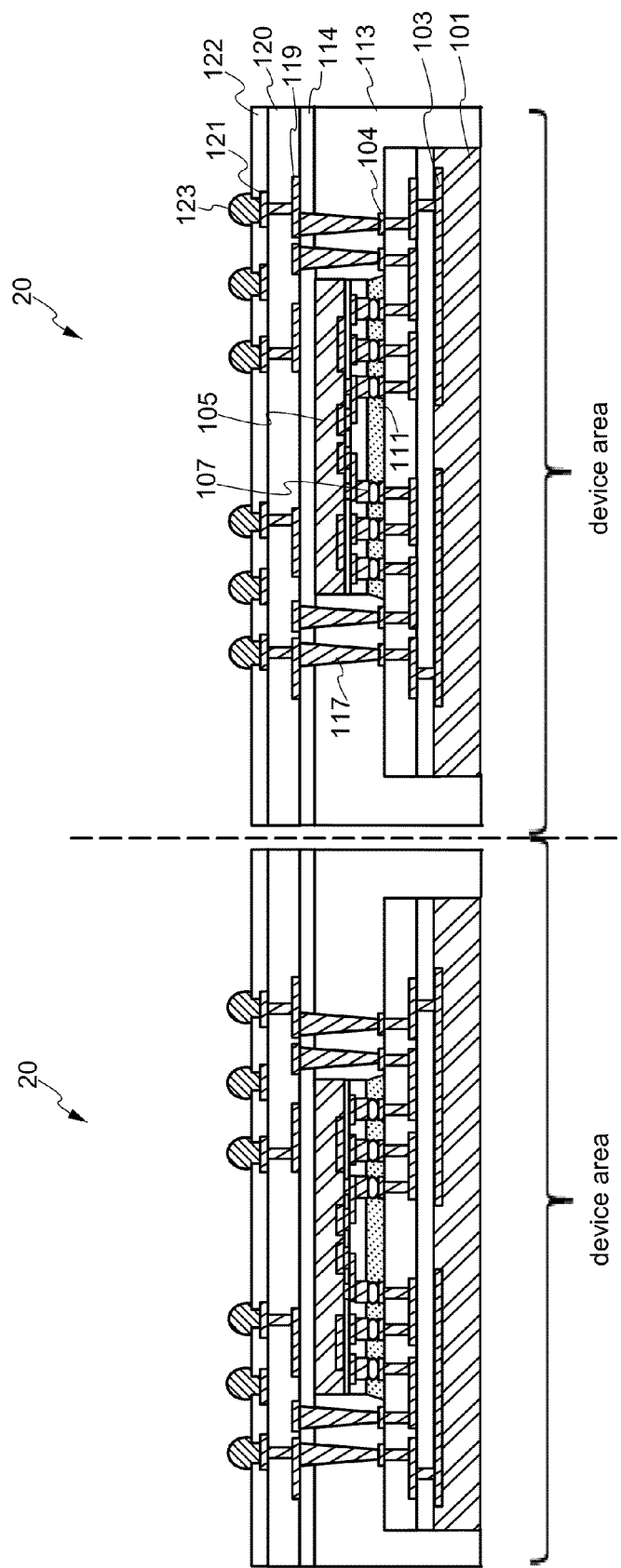
FIG. 14 shows the manufacturing method for a semiconductor device in the second embodiment according to the present invention.

Next, as shown in FIG. 13, the semiconductor wafer 101 is ground by back grinding from a rear surface thereof in which the first semiconductor element 103 is not provided, until the thickness of the semiconductor wafer 101 reaches a finish thickness of the semiconductor wafer 101. Then, as shown in FIG. 14, the solder resist 122, the insulating film 120, the first insulating layer 114 and the second insulating resin layer 113 are diced along the border between the device areas formed in the semiconductor wafer 101. As a result, a semiconductor device 20 is provided. The dicing width is narrower than the width of the groove 201 formed in the surface of the semiconductor wafer 101.

With the manufacturing method for a semiconductor device in the second embodiment according to the present invention, the groove 201 having a depth that is greater than, or equal to, the finish thickness of the semiconductor wafer 101 is formed in advance in the semiconductor wafer 101. Therefore, at the time when the thinning of the semiconductor wafer 101 is finished, the second insulating resin layer 113 is exposed in an area where the groove 201 was formed, at the rear surface of the semiconductor wafer 101 in which the first semiconductor element 103 is not provided, and a side surface of a portion of the semiconductor wafer 101 corresponding to each device area is covered with the second insulating resin layer 113. Namely, at the time when the grinding step of the semiconductor wafer 101 is finished, the semiconductor wafer 101 is in the state of being separated into individual pieces in correspondence with the device areas. Therefore, the dicing which separates the semiconductor device 20 into individual pieces is performed to the solder resist 122, the insulating film 120, the first insulating layer 114 and the second insulating resin layer 113.

With the manufacturing method for a semiconductor device in the second embodiment according to the present invention, like with the manufacturing method for a semiconductor device in the first embodiment, bump connection faults or shortcircuiting is suppressed from occurring due to the chip being curved at the time of bump connection. Thus, the yield and the reliability of the semiconductors are improved, and the manufacturing cost is decreased. In addition, with the manufacturing method for a semiconductor device in the second embodiment according to the present invention, the groove 201 having a width greater than the dicing width and a depth that is greater than, or equal to, the finish thickness of the semiconductor wafer 101 is formed in advance. This allows the semiconductor wafer 101 to be separated into individual pieces in correspondence with the device areas before the dicing step. The dicing is performed to the solder resist 122, the insulating film 120, the first insulating layer 114 and the second insulating resin layer 113. This suppresses chip cracks from occurring to the semiconductor wafer 101 due to the dicing. The side surface of the portion of the semiconductor wafer 101 corresponding to each device area is covered with the second insulating resin layer 113. This suppresses a line layer or the like formed on the side surface of the semiconductor wafer 101 from coming off, in addition to suppressing the chip cracks from occurring to the semiconductor wafer 101. Therefore, the yield and the reliability of the semiconductor devices are further improved.

As described above, with the manufacturing method for a semiconductor device in the second embodiment according to the present invention, the groove 201 having a width greater than the dicing width and a depth that is greater than, or equal to, the finish thickness of the semiconductor wafer 101 is formed in the surface of the semiconductor wafer 101 in which the first semiconductor element 103 is provided, along the border between the device areas, before the semiconductor wafer 101 and the semiconductor chip 105 are joined together by bump connection. The depth of the groove 201 may be less than the finish thickness of the semiconductor wafer 101.

Third Embodiment

An overview of a manufacturing method for a semiconductor device in a third embodiment according to the present invention will be described with reference to FIG. 15 through FIG. 18. In each of the manufacturing methods for a semiconductor device in the first and second embodiments, the first semiconductor element formed in each of the device areas formed in the semiconductor wafer and the second semiconductor element formed in one semiconductor chip are electrically connected to each other via the bump. Unlike with these methods, in the manufacturing method for a semiconductor device in the third embodiment, a plurality of the semiconductor chips are joined with each of the device areas of the semiconductor wafer by bump connection. In the following description of the manufacturing method for a semiconductor device in the third embodiment, the same steps or processes as those of the manufacturing method for a semiconductor device in the first and second embodiments will be omitted or simplified.

Figure 15:
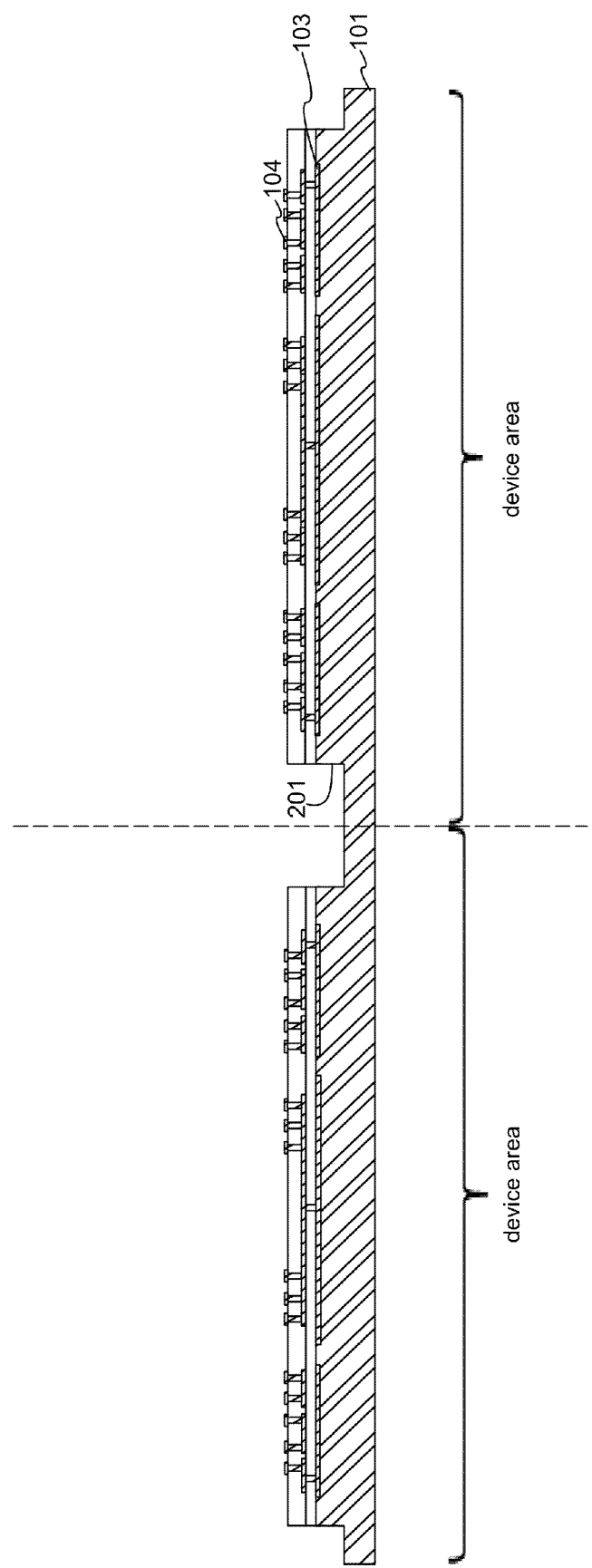
FIG. 15 shows a manufacturing method for a semiconductor device in a third embodiment according to the present invention.

First, as shown in FIG. 15, a semiconductor wafer 101 having a plurality of device areas formed therein is prepared.

Like with the manufacturing method for a semiconductor device in the second embodiment according to the present invention, a groove 201 is formed in a surface of the semiconductor wafer 101 in which a first semiconductor element 103 is provided, along a border between the device areas. The semiconductor wafer 101 may be an interposer substrate, which does not have the semiconductor element 103 and has a line layer formed therein. The step of forming the groove 201 in the semiconductor wafer 101 along the border may be omitted.

Figure 16:
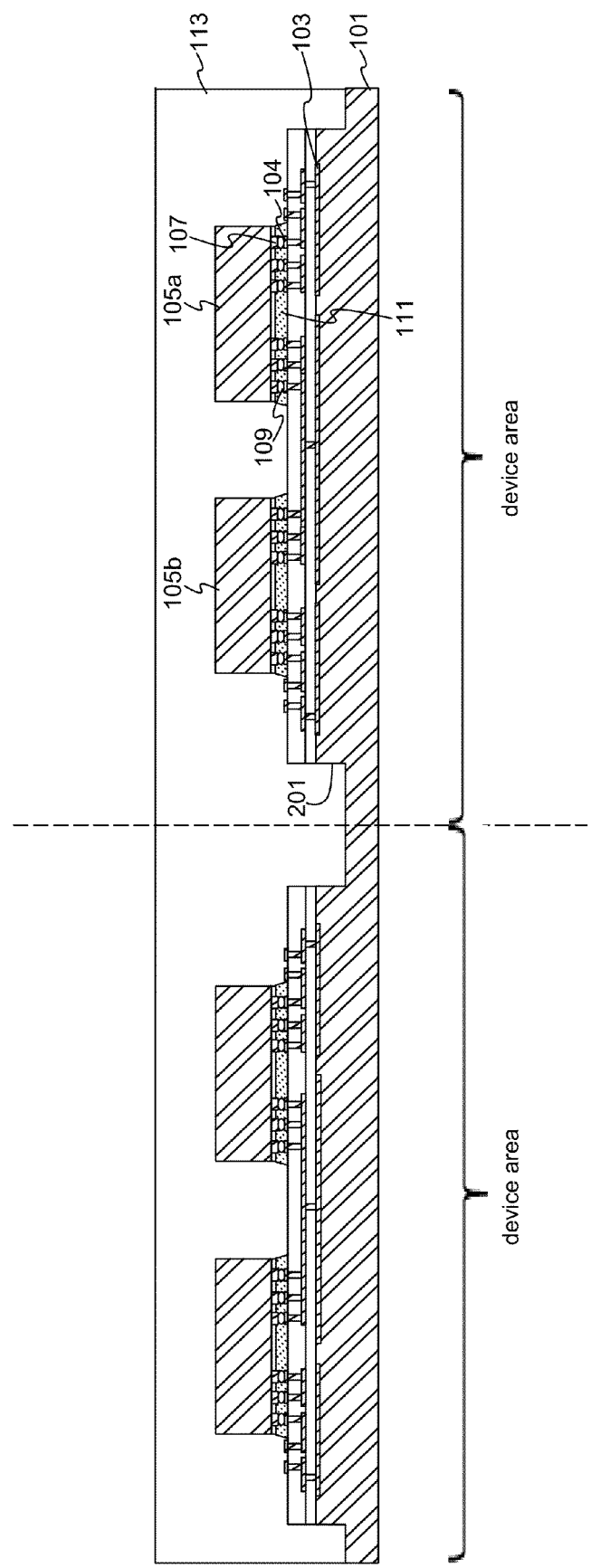
FIG. 16 shows the manufacturing method for a semiconductor device in the third embodiment according to the present invention.

Next, as shown in FIG. 16, a first semiconductor element 103 formed in each of the device areas of the semiconductor wafer 101 and second semiconductor elements (not shown) respectively formed in semiconductor chips 105a and 105b are located to face each other. Thus, an electrode 104 formed on the semiconductor wafer 101, electrically connected with the first semiconductor element 103 and facing the semiconductor chips 105a and 105b, and electrodes 107 respectively formed in the semiconductor chips 105a and 105b and electrically connected with the second semiconductor elements, are electrically connected to each other via bumps 109. In the case where the semiconductor wafer 101 is an interposer substrate, an electrode formed on the interposer substrate and electrically connected with a line formed in the interposer substrate, and the electrodes 107 electrically formed in the semiconductor chips 105a and 105b, may be connected to each other by bump connection. Then, a gap between the semiconductor wafer 101 and the semiconductor chips 105a and 105b is filled with a first insulating resin layer 111, and a second insulating resin layer 113 is formed on the semiconductor wafer 101 to have a thickness that is sufficient to embed the semiconductor chips 105a and 105b. The second insulating resin layer 113 is also used to fill the groove 201 formed in the semiconductor wafer 101. With the manufacturing method for a semiconductor device in this embodiment, the first semiconductor element 103 formed in each of the plurality of device areas of the semiconductor wafer 101, and the second semiconductor elements respectively formed in the semiconductor chips 105a and 105b, are connected to each other by bump connection.

Figure 17:
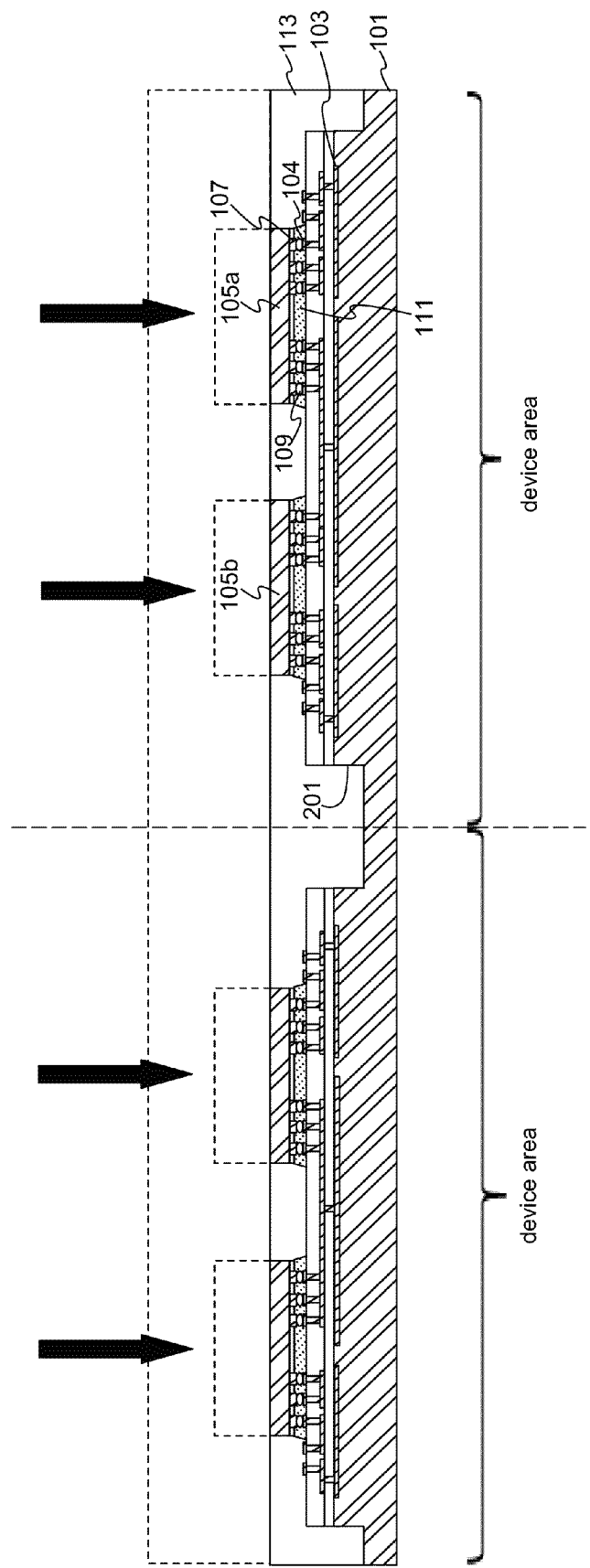
FIG. 17 shows the manufacturing method for a semiconductor device in the third embodiment according to the present invention.
Figure 18:
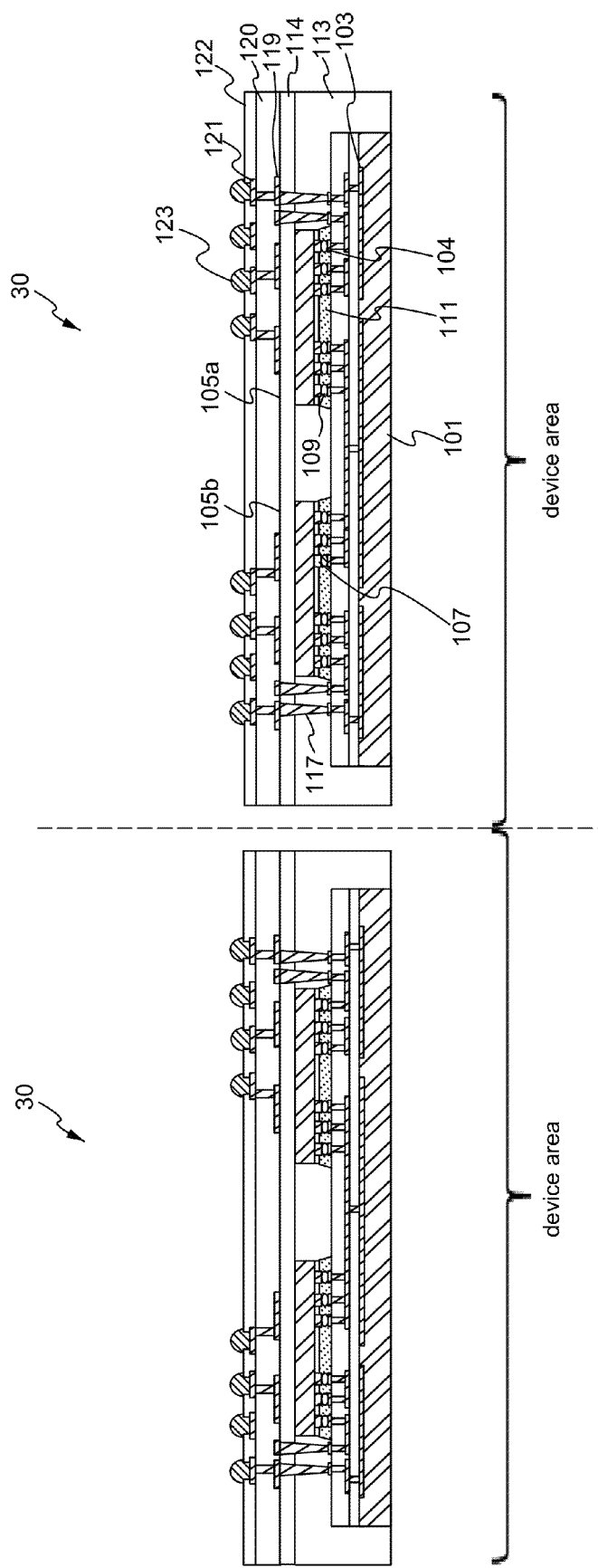
FIG. 18 shows the manufacturing method for a semiconductor device in the third embodiment according to the present invention.

Then, as shown in FIG. 17, the semiconductor chips 105a and 105b are ground by back grinding from a rear surface thereof, together with the second insulating resin layer 113, until the thickness of the semiconductor chips 105a and 105b reaches a finish thickness of the semiconductor chips 105a and 105b. Thus, the semiconductor chips 105a and 105b are thinned. After this, like with the manufacturing methods for a semiconductor device in the first and second embodiments, a first insulating layer 114 is formed on the ground surface of the semiconductor chips 105a and 105b and the second insulating resin layer 113 as shown in FIG. 18. An opening 115 is formed in the first insulating layer 114 and the second insulating resin layer 113 to expose the electrode 104 formed on the semiconductor wafer 101. A conductive layer is formed by a semi-additive process or the like on the first insulating layer 114, on the electrode 104 exposed by the opening 115 and on a side surface of the opening 115. The conductive layer is patterned to form a line 117 filling the opening 115 and a line 119 connected with the line 117. After this, an insulating film 120 is formed on the line 119, and then a terminal 121 is formed on the insulating film 120, the terminal 121 being connected with the line 119. A solder resist 122 is applied on the terminal 121, and an opening is formed in the solder resist 122 to expose the terminal 121. On the terminal 121, an external terminal 123 is formed when necessary. Then, the semiconductor wafer 101 is ground by back grinding from a rear surface thereof in which the first semiconductor element 103 is not provided, until the thickness of the semiconductor wafer 101 reaches a finish thickness of the semiconductor wafer 101. At the time when the thinning of the semiconductor wafer 101 is finished, the second insulating resin layer 113 is exposed in an area where the groove 201 was formed, at the rear surface of the semiconductor wafer 101 in which the first semiconductor element 103 is not provided. After this, as shown in FIG. 18, the solder resist 122, the insulating film 120, the first insulating layer 114 and the second insulating resin layer 113 are diced along the border between the device areas formed in the semiconductor wafer 101. As a result, a semiconductor device 30 is provided.

As shown in FIG. 18, in the semiconductor device 30, the first semiconductor element 103 formed in each of the device areas of the semiconductor wafer 101 and the second semiconductor elements (not shown) respectively formed in the two semiconductor chips 105a and 105b are connected to each other by bump connection. The present invention is not limited to this. The first semiconductor element 103 formed in each of the device areas of the semiconductor wafer 101 and the second semiconductor elements respectively formed in three or more semiconductor chips 105 may be connected to each other by bump connection.

With the manufacturing method for a semiconductor device in the third embodiment according to the present invention, even in the case where a plurality of semiconductor chips 105a and 105b are located side by side on, and joined with, each of device areas of the semiconductor wafer 101 to form a semiconductor device, bump connection faults or shortcircuiting is suppressed from occurring due to the chip being curved at the time of bump connection, like with the manufacturing methods for a semiconductor device in the first and second embodiments according to the present invention. Thus, the yield and the reliability of the semiconductors are improved, and the manufacturing cost is decreased.

Fourth Embodiment

An overview of a manufacturing method for a semiconductor device in a fourth embodiment according to the present invention will be described with reference to FIG. 19 through FIG. 25. Unlike with the manufacturing methods for a semiconductor device in the first and second embodiments, with the manufacturing method for a semiconductor device in the fourth embodiment, the first semiconductor element formed in each of the device areas of the semiconductor wafer and the second semiconductor element formed in the semiconductor chip are joined together via another semiconductor chip having a TSV (Through-Silicon Via) formed therein. In the following description of the manufacturing method for a semiconductor device in the fourth embodiment, the same steps or processes as those of the manufacturing method for a semiconductor device in the first and second embodiments will be omitted or simplified.

Figure 19:
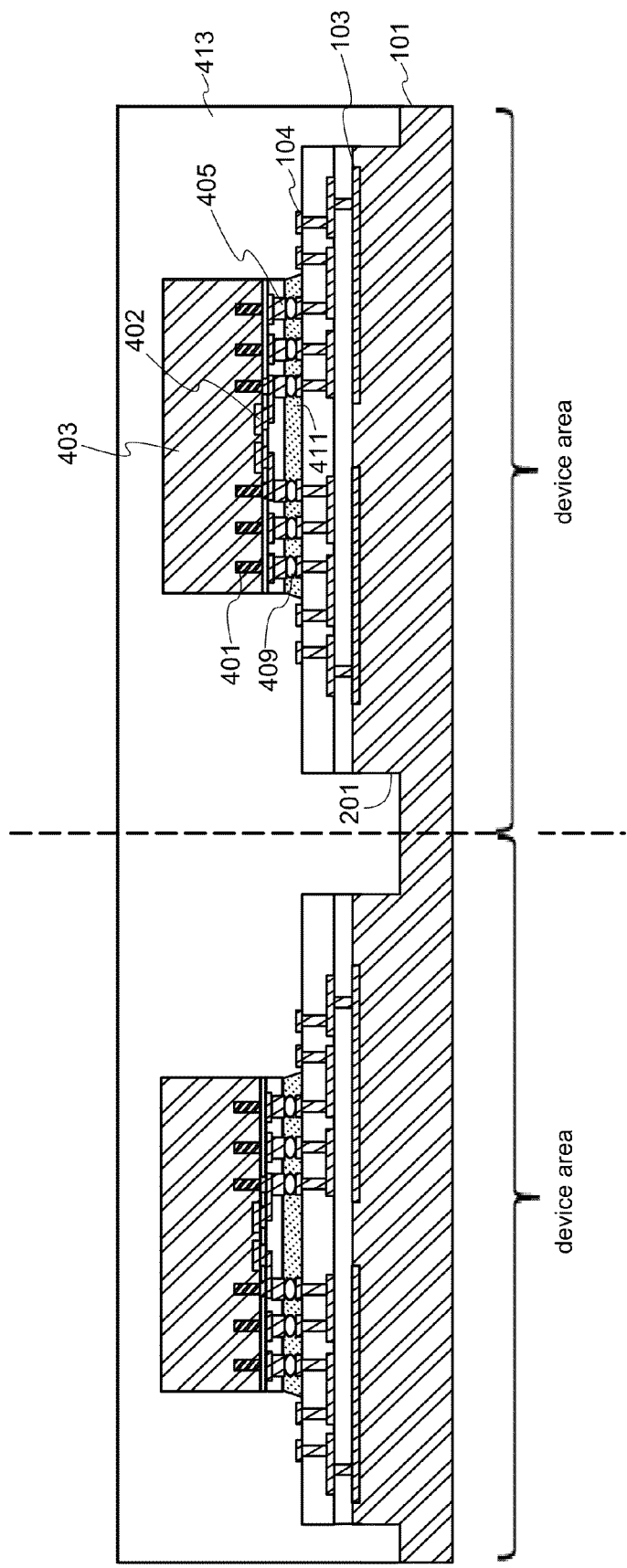
FIG. 19 shows a manufacturing method for a semiconductor device in a fourth embodiment according to the present invention.

First, as shown in FIG. 19, a semiconductor wafer 101 having a plurality of device areas formed therein is prepared. Like with the manufacturing method for a semiconductor device in the second embodiment according to the present invention, a groove 201 is formed in a surface of the semiconductor wafer 101 in which a first semiconductor element 103 is provided, along a border between the device areas. The semiconductor wafer 101 may be an interposer substrate, which does not have the semiconductor element 103 and has a line layer formed therein. The step of forming the groove 201 in the semiconductor wafer 101 along the border may be omitted.

Next, a semiconductor substrate 403 having an embedded electrode 401 formed therein (hereinafter, referred to as a "first semiconductor chip 403") is prepared. The embedded electrode 401 is formed in the first semiconductor chip 403, and one of two ends thereof is connected with a second semiconductor element 402 formed in the first semiconductor chip 403 via a line layer. The embedded electrode 401 is formed as follows. A via is formed in the first semiconductor chip 403 by reactive ion etching or the like, an insulating film is formed of $SiO_2$, SiN or the like on a side wall of the via by use of CVD or the like, and the via is filled with a conductive material, for example, a metal material such as copper or the like by use of electric plating or the like. An electrode 405 for external connection is formed on the first semiconductor chip 403, the electrode 405 being electrically connected with the second semiconductor element 402 and the embedded electrode 401.

Next, as shown in FIG. 19, an electrode 104 connected with the first semiconductor element 103 formed in each of the device areas of the semiconductor wafer 101 and facing the first semiconductor chip 403, and the embedded electrode 401 formed in the first semiconductor chip 403, are electrically connected to each other via a first bump 409. Specifically, the first bump 409 is formed on the electrode 104 formed on the semiconductor wafer 101 and/or the electrode 405, and the electrode 104 and the electrode 405 are located to face each other and joined together by heat treatment. In the case where the semiconductor wafer 101 is an interposer substrate, an electrode formed on the interposer substrate and electrically connected with a line formed in the interposer substrate, and the electrode 405 electrically connected with the second semiconductor element 402, may be connected to each other by bump connection.

After the semiconductor wafer 101 and the first semiconductor chip 403 are joined together via the first bump 409, a gap between the semiconductor wafer 101 and the first semiconductor chip 403 is filled with a first insulating resin layer 411. The first insulating resin layer 411 may be formed before the semiconductor wafer 101 and the semiconductor chip 403 are joined together by bump connection.

Figure 20:
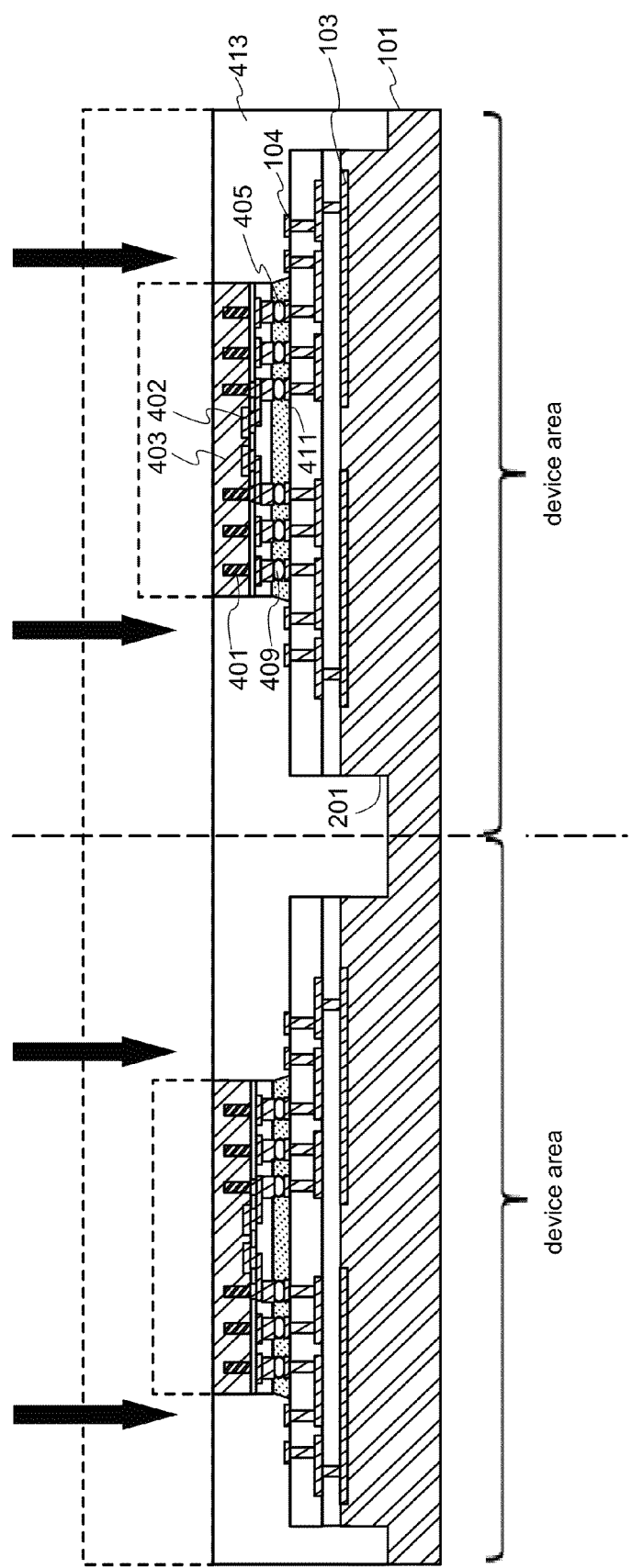
FIG. 20 shows the manufacturing method for a semiconductor device in the fourth embodiment according to the present invention.

Next, a second insulating resin layer 413 is formed on the semiconductor wafer 101 to have a thickness that is sufficient to embed the first semiconductor chip 403. The second insulating resin layer 413 is formed of the same material as that of the second insulating resin layer 113 described in the first embodiment according to the present invention. After the second insulating resin layer 413 is cured, a BSG tape is bonded to a rear surface of the semiconductor wafer 101 in which the first semiconductor element 103 is not provided. As shown in FIG. 20, the first semiconductor chip 403 is ground by back grinding from a rear surface of the semiconductor chip 403 in which the embedded electrode 401 is not provided to a position slightly before the other of the two ends of the embedded electrode 401, together with the second insulating resin layer 413. Thus, the first semiconductor chip 403 is thinned.

Figure 21:
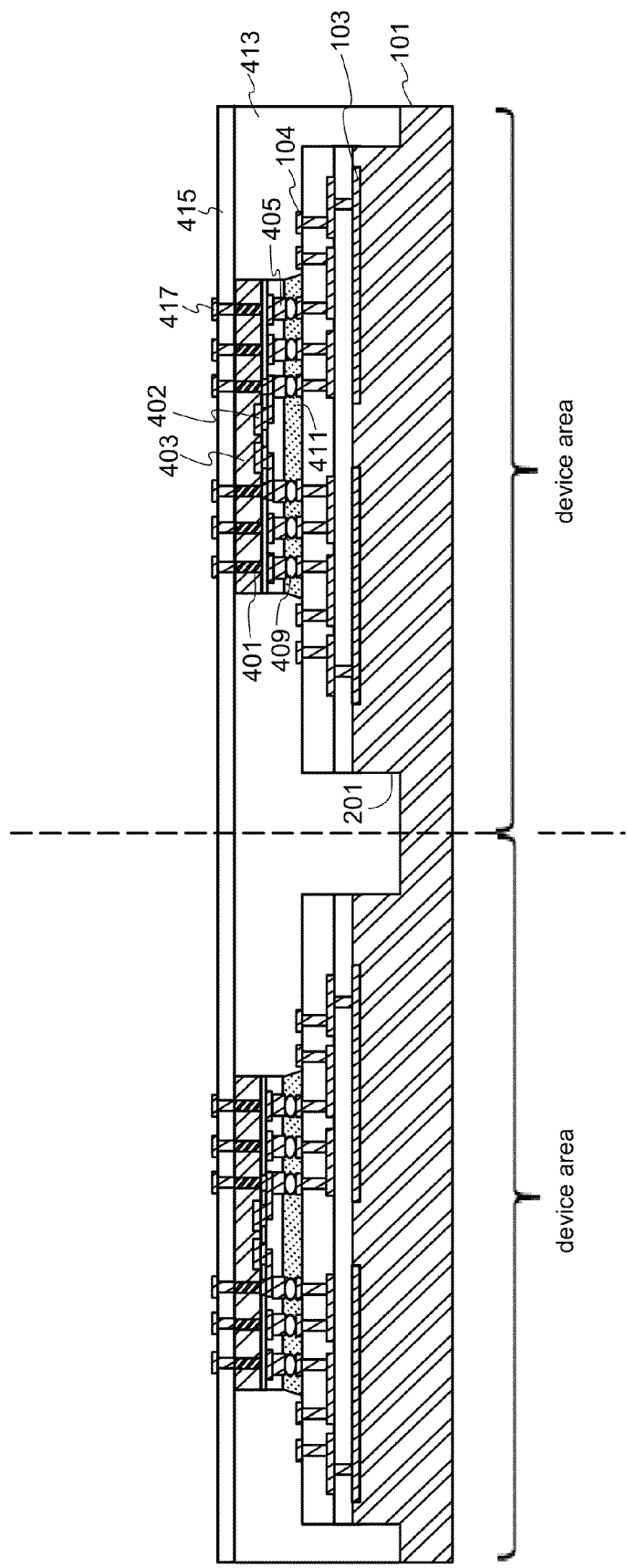
FIG. 21 shows the manufacturing method for a semiconductor device in the fourth embodiment according to the present invention.

After the BSG tape is peeled off from the rear surface of the semiconductor wafer 101, the first semiconductor chip 403 is ground by CMP or the like to expose the other end of the embedded electrode 401. Thus, the embedded electrode 401 acts as a TSV running through the first semiconductor chip 403. Next, as shown in FIG. 21, a first insulating layer 415 is formed on the first semiconductor chip 403 to cover the exposed other end of the embedded electrode 401. The first insulating layer 415 may be formed by, for example, applying an epoxy-based resin coating material for a build-up wiring board. Alternatively, the first insulating layer 415 may be formed of a film-type interlayer insulating material, which is easy to handle, or formed of a resin-attached copper foil or the like that assists a line formation step described below. Then, the first insulating layer 415 is etched to form a contact hole to expose the other end of the embedded electrode 401. A terminal 417 is formed on the first insulating layer 415, the terminal 417 being connected with the embedded electrode 401 via the contact hole. The terminal 417 may be formed of Cu or the like. In the case where the terminal 417 is formed of Cu, a barrier layer formed of Ni, Au or the like may be formed on the Cu terminal 417 in order to prevent the Cu terminal 417 from being formed into an alloy with solder that is connected thereto in a later step.

Figure 22:
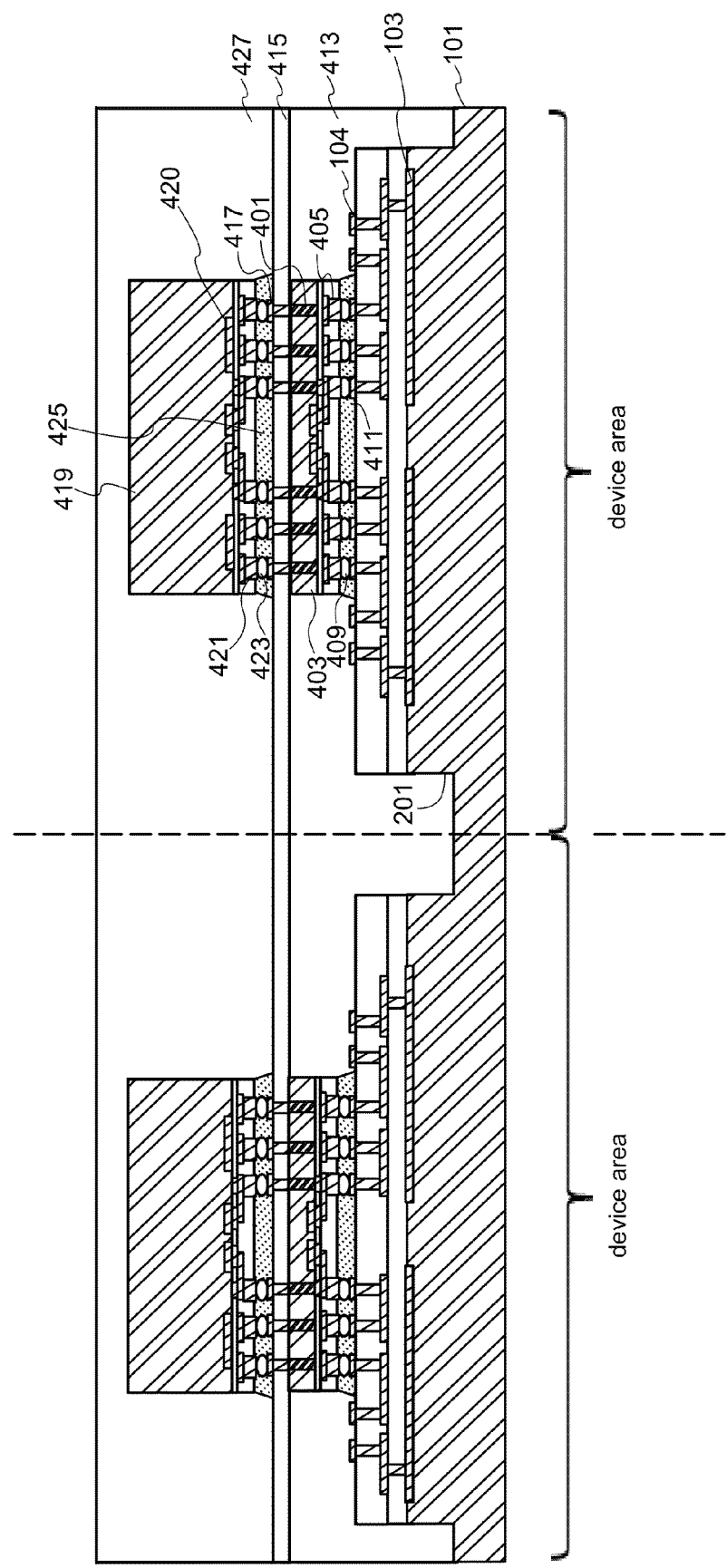
FIG. 22 shows the manufacturing method for a semiconductor device in the fourth embodiment according to the present invention.

Next, as shown in FIG. 22, a second semiconductor chip 419 having a third semiconductor element 420 formed therein is prepared. As shown in FIG. 22, an electrode 421 electrically connected with the third semiconductor element 420 formed in the second semiconductor chip 419, and the terminal 417 connected to the other end of the embedded electrode 401, are electrically connected to each other via a second bump 423, and the first semiconductor chip 403 and the second semiconductor chip 419 are joined together. Specifically, the second bump 423 is formed on the terminal 417 connected with the other end of the embedded electrode 401 formed on the first insulating layer 415 and/or the electrode 421 formed on the second semiconductor chip 419, and the electrode 417 and the electrode 421 are located to face each other and joined together by heat treatment.

After the other end of the embedded electrode 401 and the second semiconductor chip 419 are joined together via the second bump 423, a gap between the first insulating layer 415 and the second semiconductor chip 419 is filled with an underfill (hereinafter, referred to as a "third insulating resin layer") 425. The third insulating resin layer 425 may be formed of any insulating resin usable for an underfill with no specific limitation. The third insulating resin layer 425 may be formed before the other end of the embedded electrode 401 and the second semiconductor chip 415 are joined together by bump connection.

Next, an insulating resin layer (hereinafter, referred to as a "fourth insulating resin layer") 427 is formed on the first insulating layer 415 to have a thickness that is sufficient to embed the second semiconductor chip 419. The fourth insulating resin layer 427 is formed of the same material as that of the second insulating resin layer 113 described in the first embodiment according to the present invention, like the second insulating resin layer 413.

Figure 23:
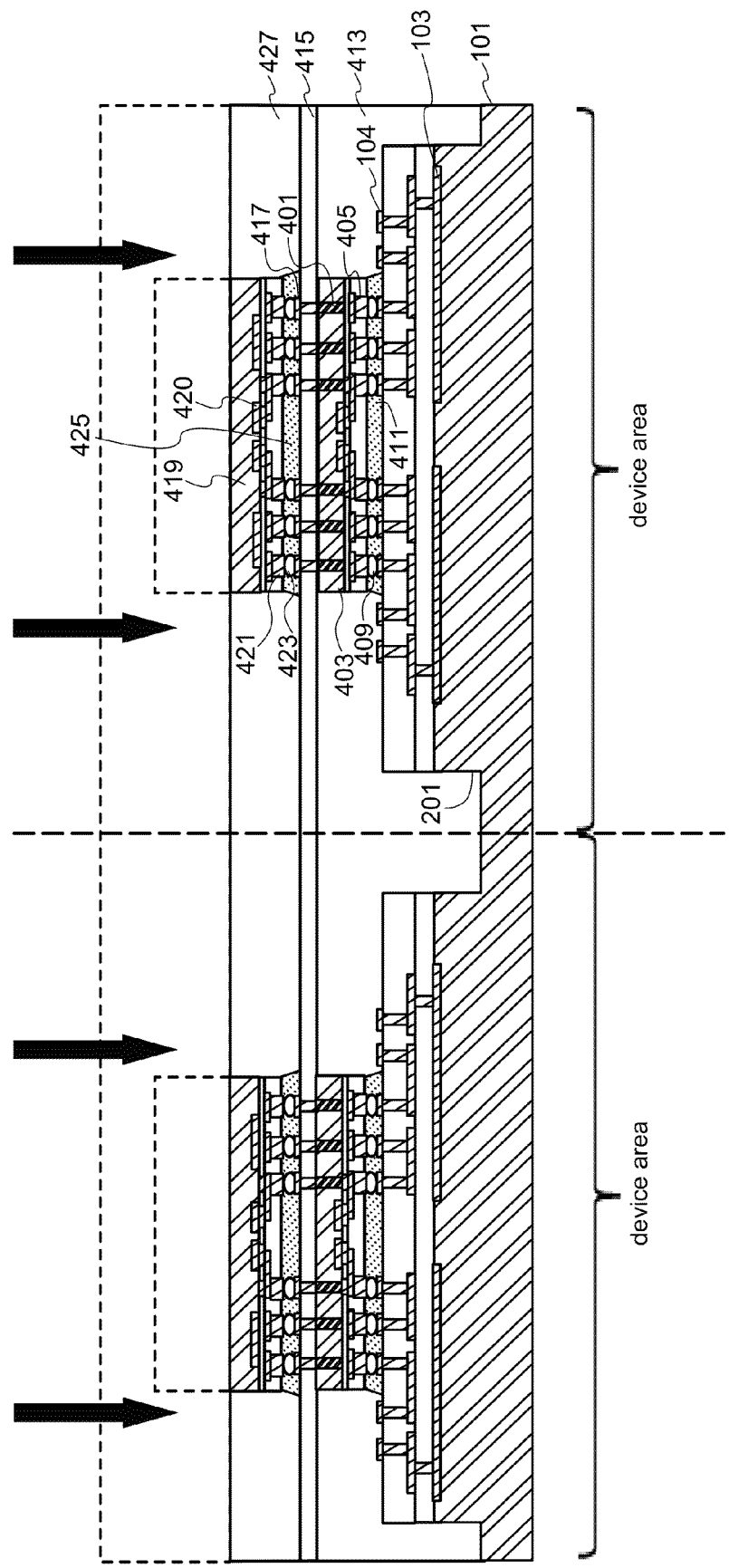
FIG. 23 shows the manufacturing method for a semiconductor device in the fourth embodiment according to the present invention.

After the fourth insulating resin layer 427 is cured, as shown in FIG. 23, the second semiconductor chip 419 is ground by back grinding from a rear surface thereof in which the third semiconductor element 420 is not provided, together with the fourth insulating resin layer 427, until the thickness of the second semiconductor chip 419 reaches a desired thickness (finish thickness of the second semiconductor chip 419). The second semiconductor chip 419 and the fourth insulating resin layer 427 are ground as follows. A BSG tape is bonded to the rear surface of the semiconductor wafer 101 in which the first semiconductor element 103 is not provided, and the second semiconductor chip 419 is thinned by a back grinding step. After the thinning of the second semiconductor chip 419 is finished, the BSG tape is peeled off from the rear surface of the semiconductor wafer 101.

Figure 24:
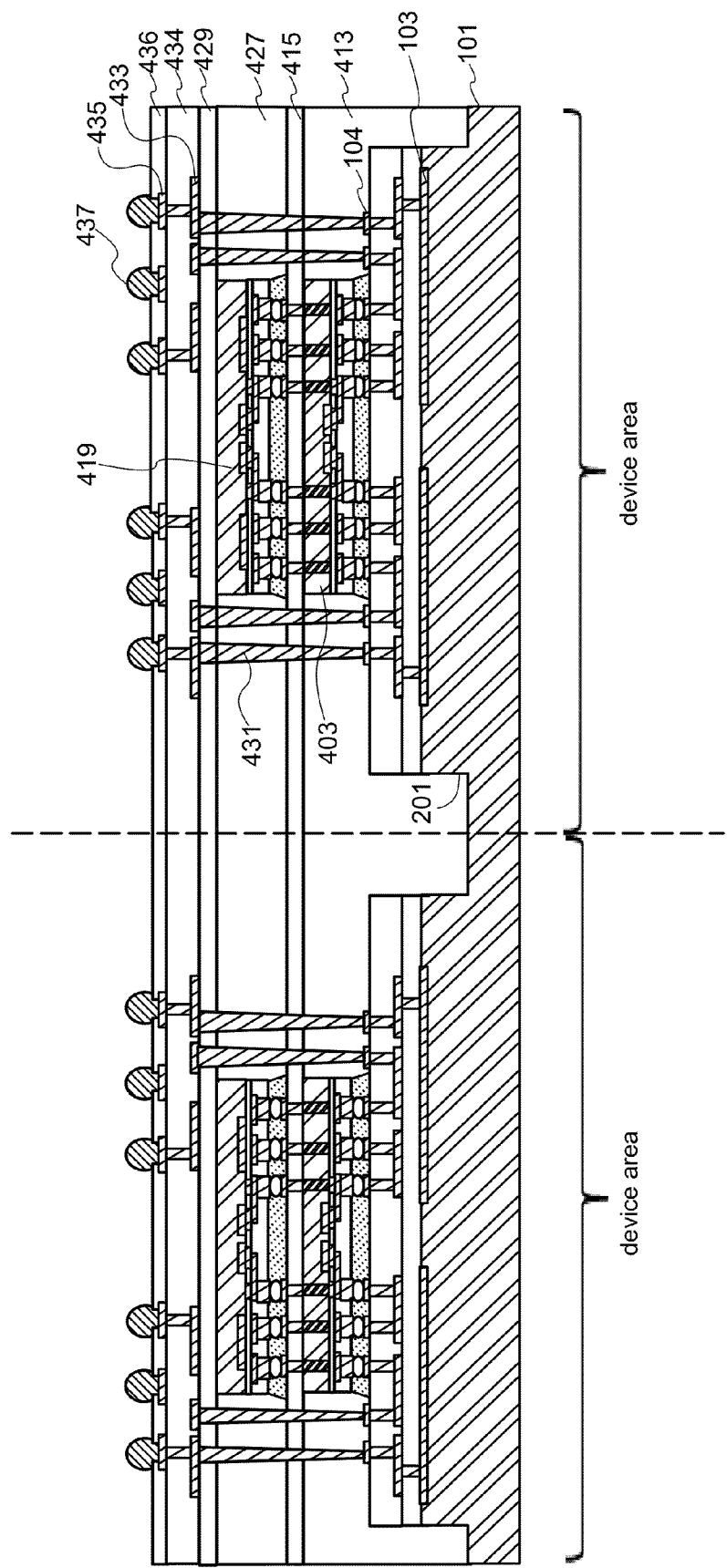
FIG. 24 shows the manufacturing method for a semiconductor device in the fourth embodiment according to the present invention.

Next, as shown in FIG. 24, a second insulating layer 429 is formed on the ground surface of the second semiconductor chip 419 and the fourth insulating resin layer 427. The second insulating layer 429 may be formed of the same material as that of the first insulating layer 415. As shown in FIG. 24, an opening is formed in the second insulating layer 429, the fourth insulating resin layer 427, the first insulating layer 415 and the second insulating resin layer 413 to expose the electrode 104 formed on the semiconductor wafer 101. A conductive layer is formed by a semi-additive process or the like on the second insulating layer 429, on the electrode 104 exposed by the opening and on a side surface of the opening. The conductive layer is patterned to form a line 431 filing the opening and a line 433 connected with the line 431. Then, an insulating film 434 is formed on the line 433, and a terminal 435 is formed on the insulating film 434, the terminal 435 being connected with line 433. A solder resist 436 is applied on the terminal 435, and an opening is formed in the solder resist 436 to expose the terminal 435. On the terminal 435, an external terminal 437 is formed on the terminal 435 when necessary. The external terminal 437 may be formed of BGA balls.

Figure 25:
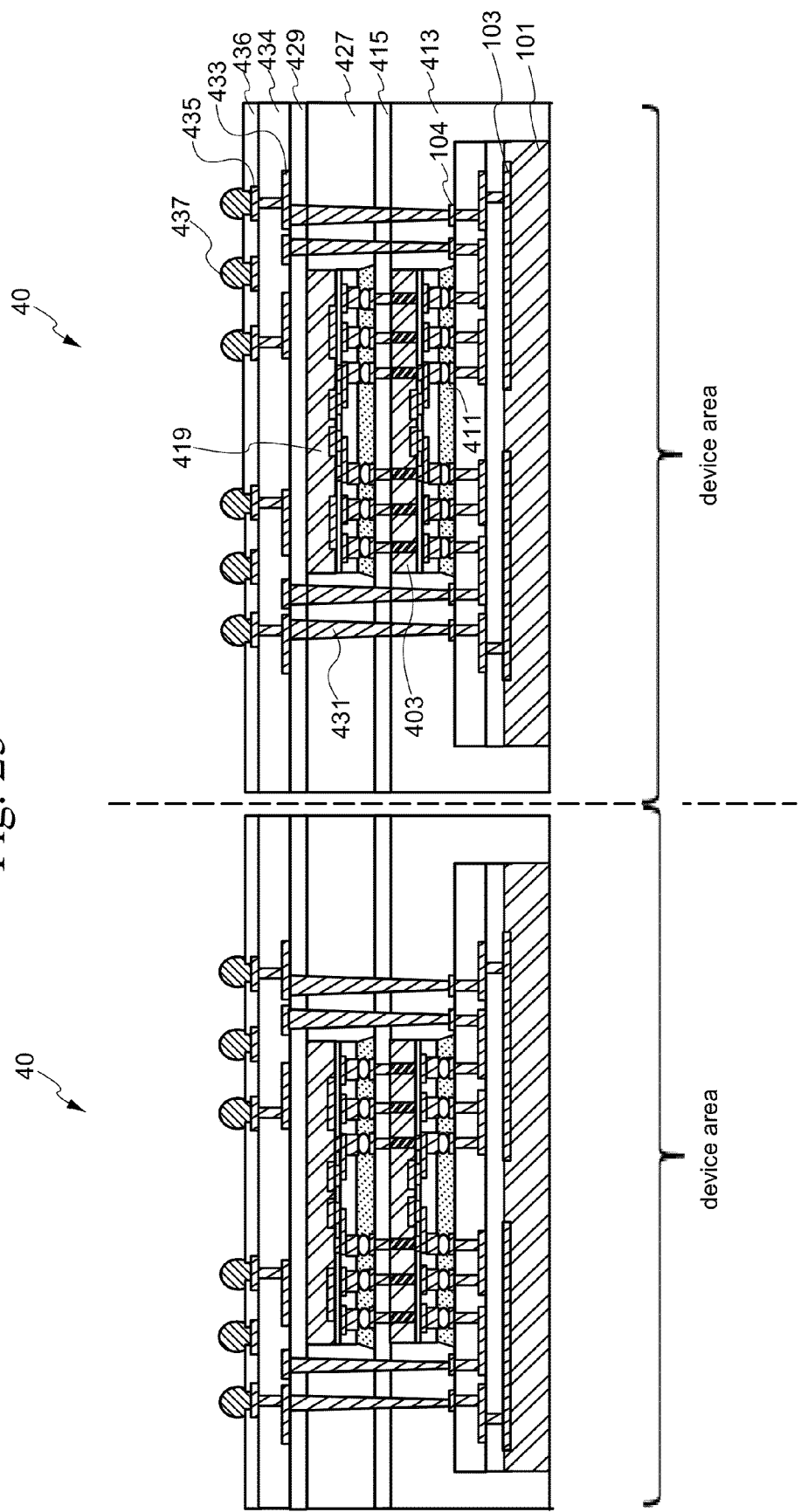
FIG. 25 shows the manufacturing method for a semiconductor device in the fourth embodiment according to the present invention.

Then, as shown in FIG. 25, the semiconductor wafer 101 is ground by back grinding from the rear surface thereof in which the first semiconductor element 103 is not provided, until the thickness of the semiconductor wafer 101 reaches the finish thickness of the semiconductor wafer 101. At the time when the thinning of the semiconductor wafer 101 is finished, the second insulating resin layer 413 is exposed in an area where the groove 201 was formed, at the rear surface of the semiconductor wafer 101 in which the first semiconductor element 103 is not provided. As shown in FIG. 25, the solder resist 436, the insulating film 434, the second insulating layer 429, the fourth insulating resin layer 427, the first insulating layer 415 and the second insulating resin layer 413 are diced along the border between the device areas formed in the semiconductor wafer 101. As a result, a semiconductor device 40 is provided.

Before the semiconductor device 40 is diced into individual pieces, an insulating film formed of an insulating resin or the like may be formed, when necessary, on the rear surface of the semiconductor wafer 101 and cured. In the case where the insulating film is formed on the rear surface of the semiconductor wafer 101, the insulating film formed on the rear surface of the semiconductor wafer 101 is diced together with the solder resist 436, the insulating film 434, the second insulating layer 429, the fourth insulating resin layer 427, the first insulating layer 415 and the second insulating resin layer 413. In the case where the groove 201 is not formed in the semiconductor wafer 101 in advance, the semiconductor wafer 101 is diced together with the solder resist 436, the insulating film 434, the second insulating layer 429, the fourth insulating resin layer 427, the first insulating layer 415 and the second insulating resin layer 413.

With the manufacturing method for a semiconductor device in the fourth embodiment according to the present invention, a semiconductor device including at least three layers of stacked chips including a semiconductor chip having a TSV formed therein is manufactured. The semiconductor device manufactured by this manufacturing method suppresses bump connection faults or shortcircuiting from occurring due to the chip being curved at the time of bump connection and is manufactured at improved yield with improved reliability. In addition, like with the manufacturing methods for a semiconductor device in the first and second embodiments according to the present invention, the manufacturing cost is decreased.

In the semiconductor device 40 manufactured by the manufacturing method described with reference to FIG. 19 through FIG. 25, one first semiconductor chip 403 having a TSV formed therein and one second semiconductor chip 419 including the third semiconductor element 420 formed therein are stacked on each of the device area of the semiconductor wafer 101. Alternatively, like with the above-described manufacturing method for a semiconductor device in the third embodiment according to the present invention, a plurality of the first semiconductor chips 403 each having a TSV formed therein and a plurality of the second semiconductor chips 419 each including the third semiconductor elements 420 formed therein may be stacked on each of the device area of the semiconductor wafer 101. Namely, a plurality of the first semiconductor chips 403 are located side by side on, and joined with, each of the device areas of the semiconductor wafer 101, and a plurality of the second semiconductor chips 419 may be respectively located on, and joined with, the plurality of the first semiconductor chips 403.

Figure 26:
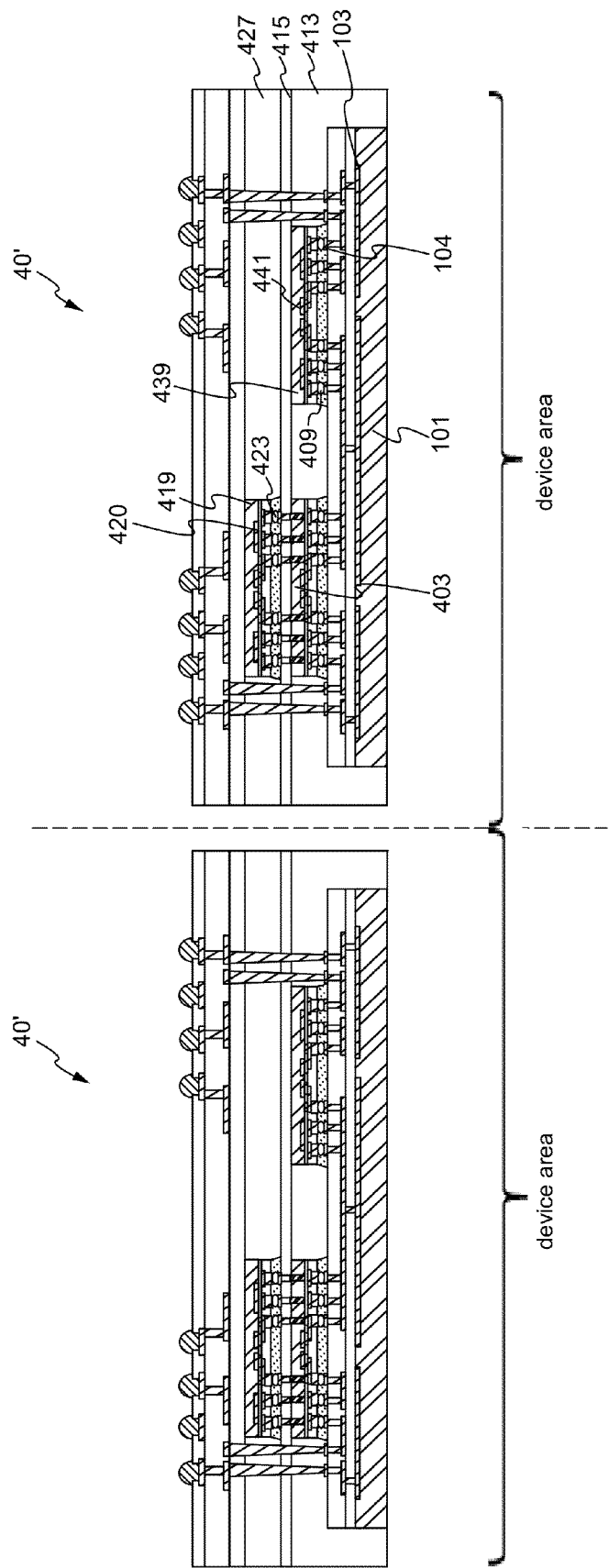
FIG. 26 shows the manufacturing method for a semiconductor device in a modification of the fourth embodiment according to the present invention.

In the case where a plurality of semiconductor chips including a semiconductor chip having a TSV formed therein are located side by side on a device area of the semiconductor wafer and stacked, the number of the semiconductor chips to be stacked may be different within one semiconductor device. For example, it is assumed that two semiconductor chips are located side by side on one device area of the semiconductor wafer and joined with a semiconductor wafer via bumps. In this case, as in a semiconductor device 40' in an embodiment according to the present invention shown in FIG. 26, among the two semiconductor chips located side by side on the device area of the semiconductor wafer 101, one may be the first semiconductor chip 403 having a TSV formed therein, whereas the other may be a third semiconductor chip 439 including a fourth semiconductor element 441 formed therein. In this case also, the semiconductor chips are joined with the semiconductor wafer 101 via the first bumps 409. In this case, the two semiconductor chips 403 and 439 may be joined with the semiconductor wafer 101 via the first bump 409. In this case, the second semiconductor chip 419 including the third semiconductor element 420 formed therein may be located on, and joined with, the first semiconductor chip 403 having the TSV formed therein, via the second bump 423.

Fifth Embodiment

An overview of a manufacturing method for a semiconductor device in a fifth embodiment according to the present invention will be described with reference to FIG. 27 through FIG. 33. Unlike the manufacturing methods for a semiconductor device in the first to fourth embodiments, the manufacturing method for a semiconductor device in the fifth embodiment uses a semiconductor wafer in which a first semiconductor element and a TSV having an end connected with the first semiconductor element are formed in each of device areas. In the following example of the manufacturing method for a semiconductor device in the fifth embodiment according to the present invention, a semiconductor wafer that is the same as that used in the manufacturing method for a semiconductor device in the second embodiment except for having a TSV formed therein is used. In the following description, the same steps or processes as those of the manufacturing method for a semiconductor device in the second embodiment will be omitted or simplified.

Figure 27:
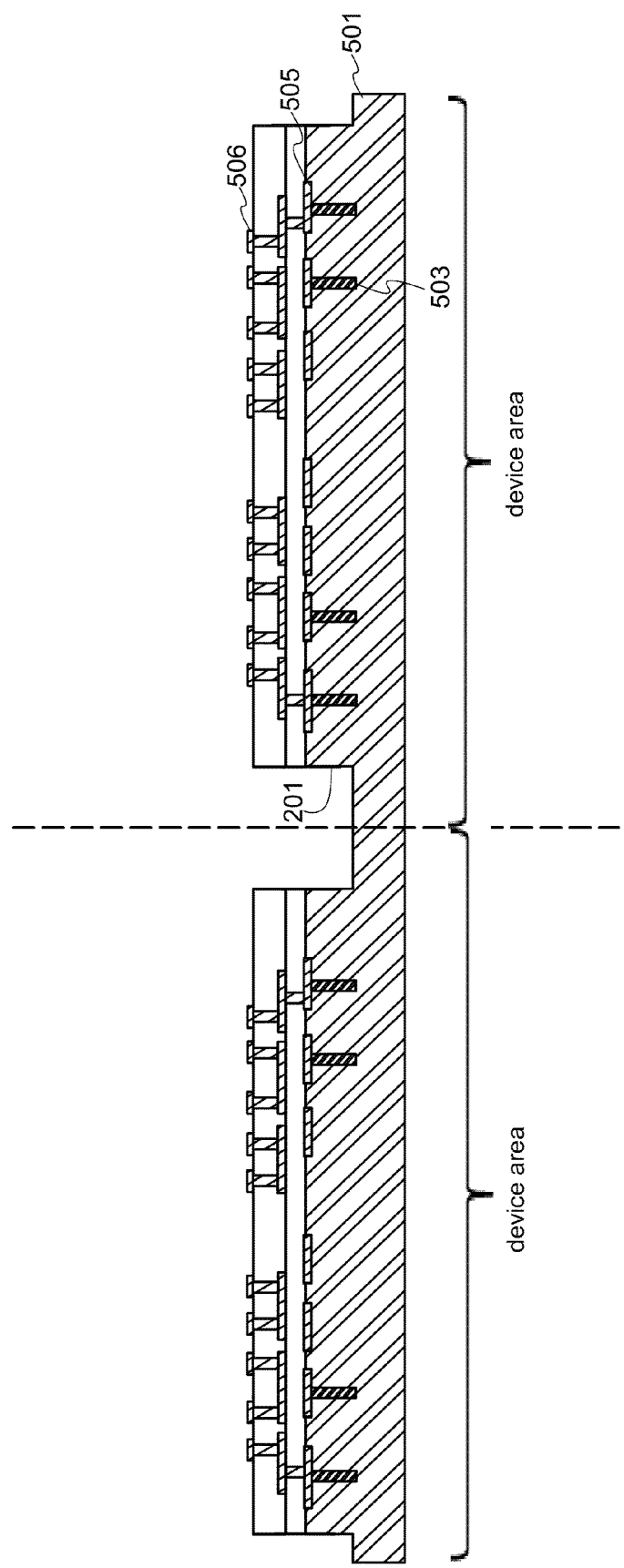
FIG. 27 shows a manufacturing method for a semiconductor device in a fifth embodiment according to the present invention.

First, a semiconductor wafer 501 having a plurality of device areas formed therein is prepared. As shown in FIG. 27, the semiconductor wafer 501 includes an embedded electrode 503 formed therein. One of two ends of the embedded electrode 503 is exposed. The semiconductor wafer 501 also includes a first semiconductor element 505 electrically connected with the exposed end of the embedded electrode 503. Like with the manufacturing method for a semiconductor device in the second embodiment according to the present invention, a groove 201 is formed in a surface of the semiconductor wafer 501 in which the first semiconductor element 505 is formed, along a border between the device areas.

Figure 28:
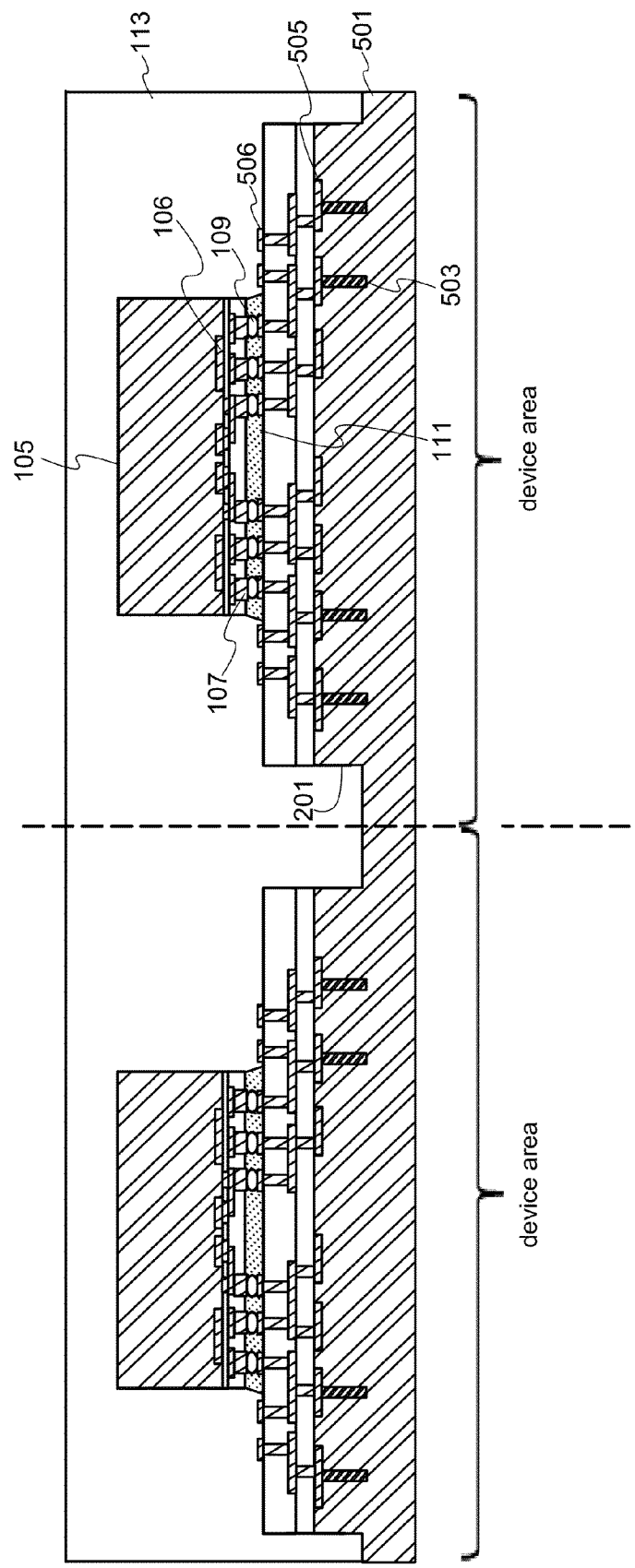
FIG. 28 shows the manufacturing method for a semiconductor device in the fifth embodiment according to the present invention.

Like with the manufacturing method for a semiconductor device in the second embodiment according to the present invention, as shown in FIG. 28, an electrode 506 connected with the first semiconductor element 505 formed in the semiconductor wafer 501 and facing a semiconductor chip 105, and an electrode 107 connected with a second semiconductor element 106 formed in the semiconductor chip 105 via a line, are electrically connected to each other via a bump 109, and thus the semiconductor wafer 501 and the semiconductor chip 105 are joined together. A gap between the semiconductor wafer 501 and the semiconductor chip 105 is filled with a first insulating resin layer 111, and a second insulating resin layer 113 is formed on the semiconductor wafer 501 to have a thickness that is sufficient to embed the semiconductor chip 105.

Figure 29:
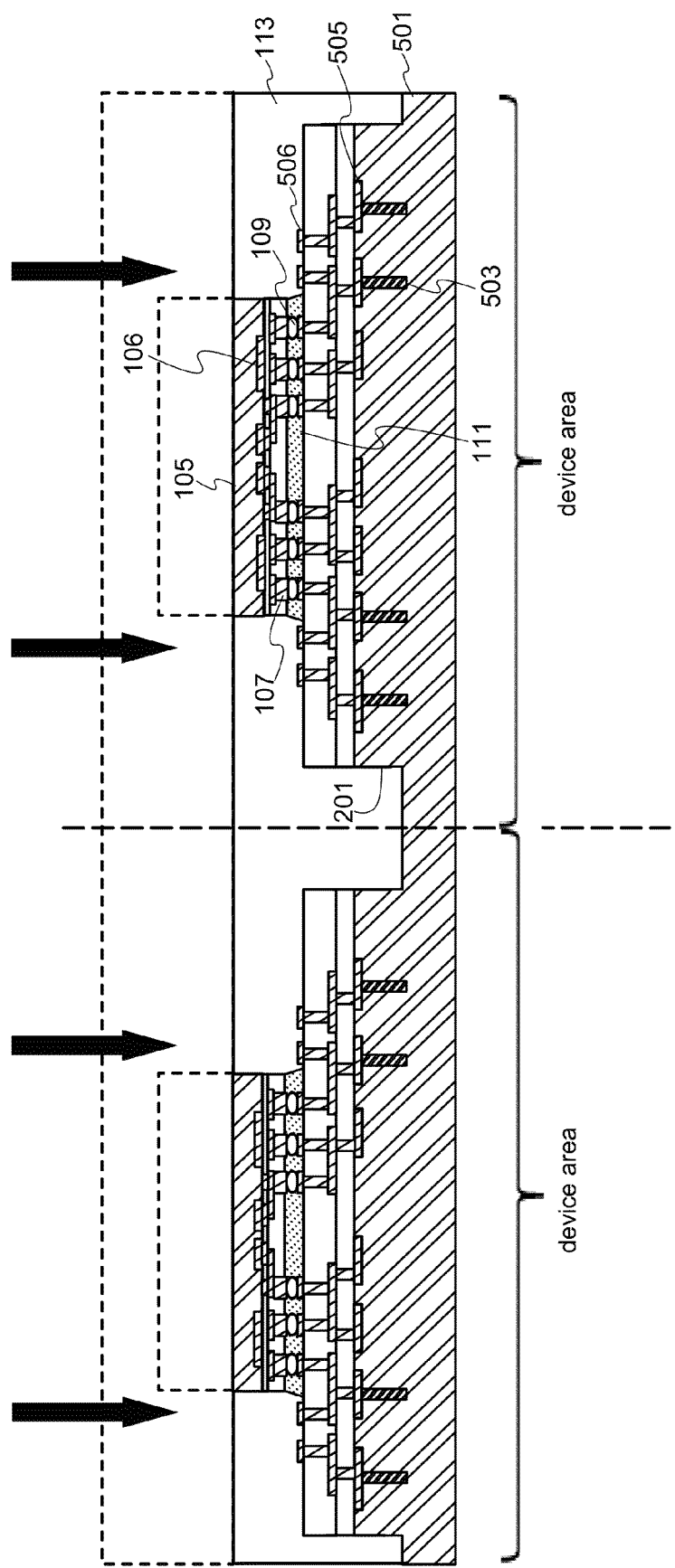
FIG. 29 shows the manufacturing method for a semiconductor device in the fifth embodiment according to the present invention.
Figure 30:
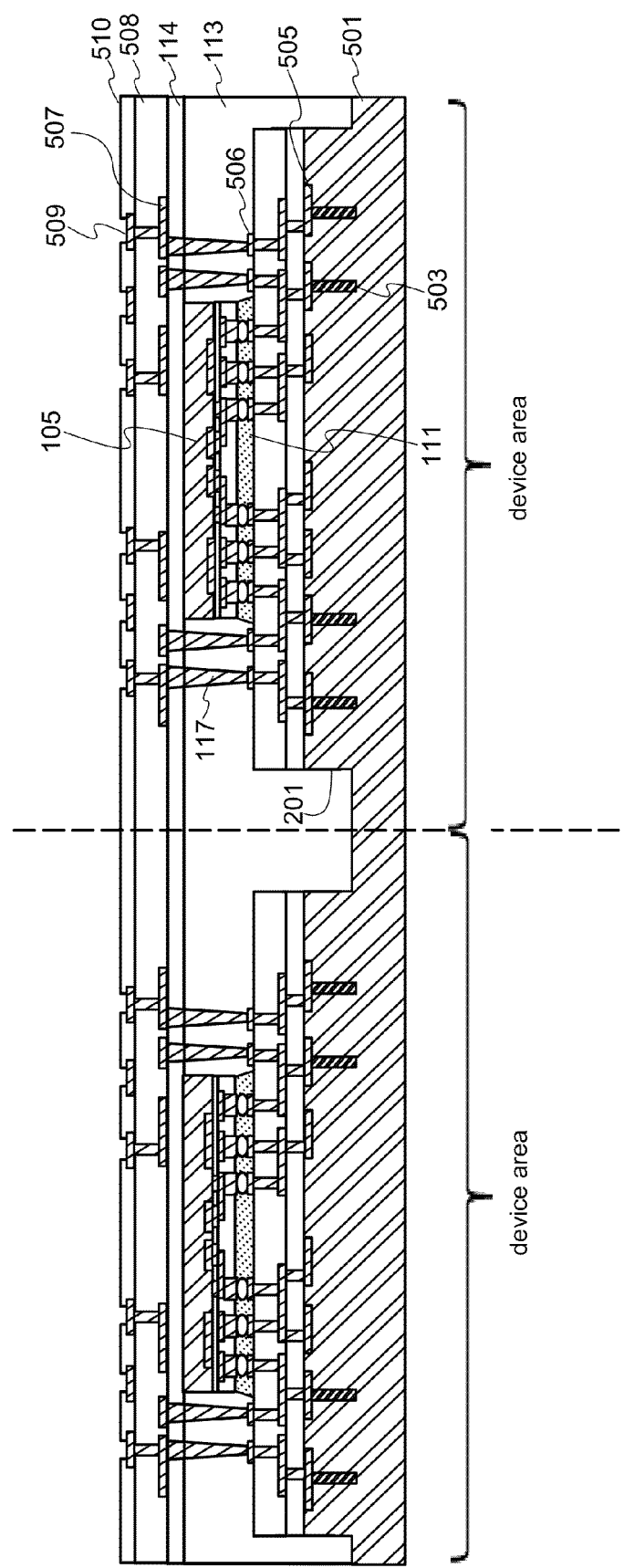
FIG. 30 shows the manufacturing method for a semiconductor device in fifth embodiment according to the present invention.

Next, as shown in FIG. 29, the semiconductor chip 105 is ground by back grinding together with the second insulating resin layer 113, until the thickness of the semiconductor chip 105 reaches a finish thickness of the semiconductor chip 105. Then, as shown in FIG. 30, a first insulating layer 114 is formed on the ground surface of the semiconductor chip 105 and the second insulating resin layer 113. An opening is formed in the first insulating layer 114 and the second insulating resin layer 113 to expose the electrode 506 formed on the semiconductor wafer 501. A conductive layer is formed by a semi-additive process or the like on the first insulating layer 114, on the electrode 506 exposed by the opening and on a side surface of the opening. The conductive layer is patterned to form a line 117 filling the opening and a line 507 connected with the line 117. Then, an insulating film 508 is formed on the line 507, and a terminal 509 is formed on the insulating film 508, the terminal 509 being connected with the line 507. A solder resist 510 is applied on the terminal 509, and an opening is formed in the solder resist 510 to expose the terminal 509.

Figure 31:
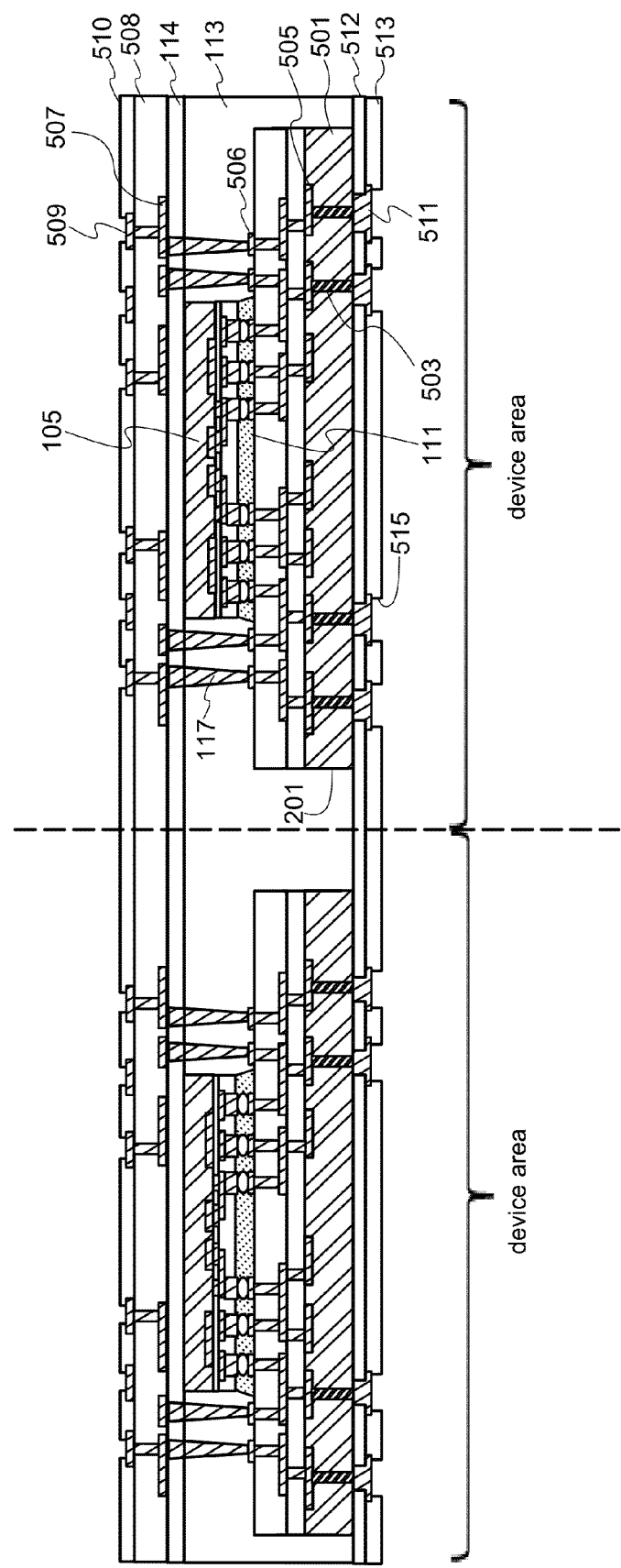
FIG. 31 shows the manufacturing method for a semiconductor device in the fifth embodiment according to the present invention.

Next, a wafer support is attached on the side of the terminal 509 formed on the semiconductor chip 105, and as shown in FIG. 31, the semiconductor wafer 501 is ground to a position slightly before the other of the two ends of the embedded electrode 503. Thus, the semiconductor wafer 501 is thinned. Then, the semiconductor wafer 501 is ground by CMP or the like to expose the other end of the embedded electrode 503. Thus, the embedded electrode 503 acts as a TSV running through the semiconductor wafer 501. At the time when the other end of the embedded electrode 503 is exposed, the second insulating resin layer 113 is exposed in an area where the groove 201 was formed, at a rear surface of the semiconductor wafer 501 in which the first semiconductor element 505 is not provided, and a side surface of a portion of the semiconductor wafer 501 corresponding to each of the device areas is covered with the second insulating resin layer 113.

Next, as shown in FIG. 31, a second insulating layer 512 is formed on the semiconductor wafer 501. The second insulating layer 512 may be formed of the same material as that of the first insulating layer 114. After an opening is formed in the second insulating layer 512 to expose the embedded electrode 503, a conductive layer including a terminal 511 is formed on the second insulating layer 512, the terminal 511 being connected with the other end of the embedded electrode 503. The conductive layer may include a line (not shown) in addition to the terminal 511. Another line layer may be formed when necessary between the semiconductor wafer 501 and the conductive layer. The terminal 511 may be formed by applying a conductive material to the entirety of a surface of the second insulating layer 512 and patterning the conductive material. Next, a solder resist 513 is applied to the entirety of a surface of the terminal 511 and the second insulating layer 512 and patterned to form an opening 515 to expose the terminal 511.

Figure 32:
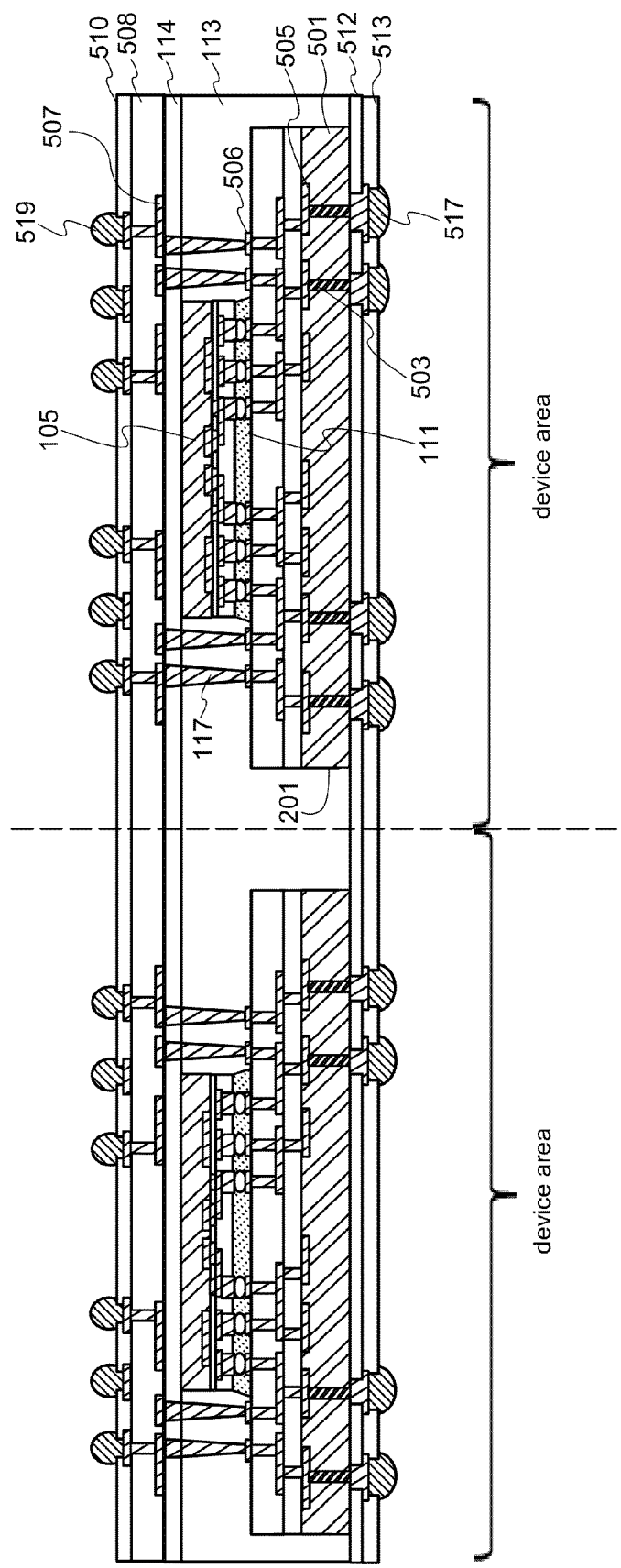
FIG. 32 shows the manufacturing method for a semiconductor device in the fifth embodiment according to the present invention.

Next, as shown in FIG. 32, the exposed terminal 511 may be subjected to an organic solderability preservative (OSP) process when necessary before an external terminal 517 is formed to fill the opening 515. The external terminal 517 may be formed of BGA balls of solder. After the external terminal 517 is formed on the semiconductor wafer 501, the wafer support is peeled off from the side of the semiconductor chip 105, and an external terminal 519 may be formed, when necessary, on the terminal 509 connected with the line 507. The external terminal 519 may be formed of BGA balls of solder.

Figure 33:
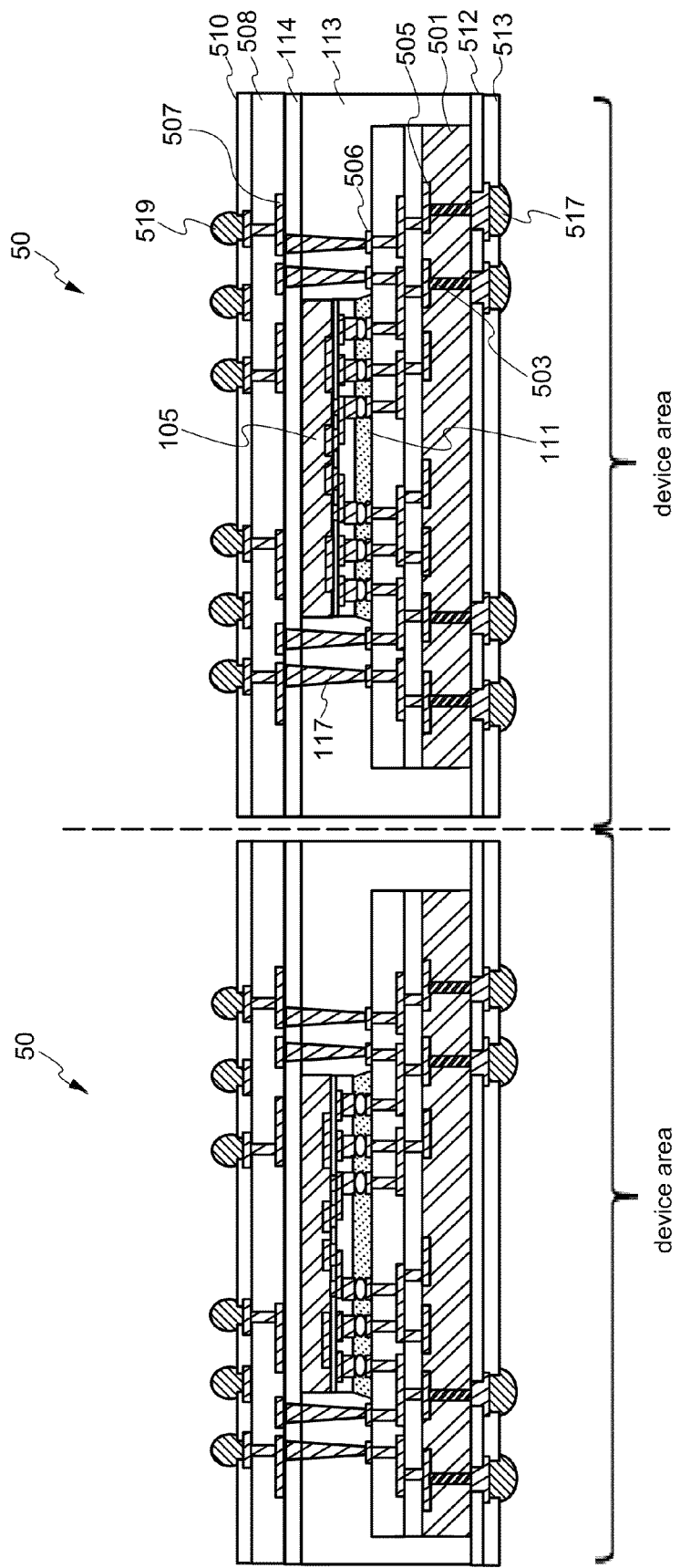
FIG. 33 shows the manufacturing method for a semiconductor device in the fifth embodiment according to the present invention.

Then, as shown in FIG. 33, the solder resist 510, the insulating film 508, the first insulating layer 114, the second insulating resin layer 113, the second insulating layer 512 and the solder resist 513 are diced along the border between the device areas formed in the semiconductor wafer 501. As a result, the pop package 50 including a stack of the thin semiconductor chips is provided.

With the manufacturing method for a semiconductor device in the fifth embodiment according to the present invention, bump connection faults or shortcircuiting is suppressed from occurring due to the chip being curved at the time of bump connection of the semiconductor chips. Thus, the pop package is produced at improved yield with improved reliability.

In the above-described example of manufacturing method for a semiconductor device in the fifth embodiment according to the present invention, a semiconductor wafer that is the same as that used in the manufacturing method for a semiconductor device in the second embodiment except for having a TSV formed therein is used. Alternatively, a semiconductor wafer having a TSV formed therein may be applied to the semiconductor wafer that is used in the manufacturing method for a semiconductor device in the first, third or fourth embodiment to manufacture a pop package.

The first and fifth embodiments according to the present invention have been described with reference to FIG. 1 through FIG. 33. The present invention is not limited to any of the above-described embodiments, and the embodiments may be appropriately altered without departing from the gist of the present invention.

What is claimed is:

1. A manufacturing method for a semiconductor device, comprising:
   preparing a semiconductor wafer including an electrode formed therein, and electrically connecting a first semiconductor element formed in a semiconductor chip and the electrode formed in the semiconductor wafer to each other via a bump;
   before or after connecting the semiconductor wafer and the semiconductor chip to each other, filling a gap between the semiconductor wafer and the semiconductor chip, facing each other, with a first insulating resin layer;
   forming a second insulating resin layer on the semiconductor wafer to have a thickness sufficient to embed the semiconductor chip;
   grinding the second insulating resin layer and the semiconductor chip until a thickness of the semiconductor chip reaches a predetermined thickness;
   forming a first insulating layer on the second insulating resin layer and the semiconductor chip, and forming an opening in the first insulating layer and the second insulating resin layer to expose the electrode;

filling the opening with a conductive material;

forming a line on the first insulating layer, the line being connected with the conductive material filling the opening;

forming a first terminal electrically connected with the line; and grinding the semiconductor wafer until a thickness of the semiconductor wafer reaches a predetermined thickness.

2. The manufacturing method for a semiconductor device according to claim 1, wherein the semiconductor wafer includes a plurality of device areas each including a second semiconductor element formed therein.

3. The manufacturing method for a semiconductor device according to claim 2, wherein a plurality of the semiconductor chips are connected with each of the plurality of device areas.

4. The manufacturing method for a semiconductor device according to claim 1, wherein the grinding of the semiconductor wafer until the thickness of the semiconductor wafer reaches the predetermined thickness is to grind the semiconductor wafer until the thickness of the semiconductor wafer reaches a finish thickness.

5. The manufacturing method for a semiconductor device according to claim 2, wherein the grinding of the semiconductor wafer until the thickness of the semiconductor wafer reaches the predetermined thickness is to grind the semiconductor wafer until the thickness of the semiconductor wafer reaches a finish thickness.

6. The manufacturing method for a semiconductor device according to claim 3, wherein the grinding of the semiconductor wafer until the thickness of the semiconductor wafer reaches the predetermined thickness is to grind the semiconductor wafer until the thickness of the semiconductor wafer reaches a finish thickness.

7. The manufacturing method for a semiconductor device according to claim 5, wherein:
the semiconductor wafer includes an embedded electrode having one of two ends thereof electrically connected with the second semiconductor element; and
the manufacturing method further comprises:
after forming the first terminal, grinding the semiconductor wafer to a position slightly before the other of the two ends of the embedded electrode;
exposing the other end of the embedded electrode; and
forming a second terminal electrically connected with the exposed other end of the embedded electrode.

8. The manufacturing method for a semiconductor device according to claim 6, wherein:
the semiconductor wafer includes an embedded electrode having one of two ends thereof electrically connected with the second semiconductor element; and
the manufacturing method further comprises:
after forming the first terminal, grinding the semiconductor wafer to a position slightly before the other of the two ends of the embedded electrode;
exposing the other end of the embedded electrode; and
forming a second terminal electrically connected with the exposed other end of the embedded electrode.

9. The manufacturing method for a semiconductor device according to claim 5, further comprising:
before connecting the electrode and the first semiconductor element via the bump, forming a groove having a width greater than a dicing width in the semiconductor wafer, along a border between the plurality of device areas; and
after grinding the semiconductor wafer until the thickness of the semiconductor wafer reaches the finish thickness, separating the semiconductor wafer into individual pieces;
wherein the separation of the semiconductor wafer into individual pieces is to separate the semiconductor wafer along the groove formed in the semiconductor wafer, with the dicing width narrower than the width of the groove.

10. The manufacturing method for a semiconductor device according to claim 9, wherein the groove has a depth greater than, or equal to, the finish thickness.

11. A manufacturing method for a semiconductor device, comprising:
preparing a semiconductor wafer including an electrode formed therein, and preparing a first semiconductor chip including a first semiconductor element and a first embedded electrode formed therein, the first embedded electrode being electrically connected with the first semiconductor element;
electrically connecting one of two ends of the first embedded electrode formed in the first semiconductor chip and the electrode formed in the semiconductor wafer to each other via a first bump;
before or after connecting the semiconductor wafer and the first semiconductor chip to each other, filling a gap between the semiconductor wafer and the first semiconductor chip, facing each other, with a first insulating resin layer;
forming a second insulating resin layer on the semiconductor wafer to have a thickness sufficient to embed the first semiconductor chip;
grinding the second insulating resin layer and the first semiconductor chip to a position slightly before the other end of the first embedded electrode;
exposing the other end of the first embedded electrode;
forming a first insulating layer on the first semiconductor chip to cover the other end of the first embedded electrode;
forming a terminal on the first insulating layer, the terminal being connected with the other end of the first embedded electrode via a contact hole;
electrically connecting the terminal and a second semiconductor element formed in a second semiconductor chip to each other via a second bump;
before or after connecting the terminal and the second semiconductor chip, filling a gap between the terminal/the first insulating layer and the second semiconductor chip, facing each other, with a third insulating resin layer;
forming a fourth insulating resin layer on the first insulating layer to have a thickness sufficient to embed the second semiconductor chip;
grinding the fourth insulating resin layer and the second semiconductor chip until a thickness of the second semiconductor chip reaches a predetermined thickness;
forming a second insulating layer on the fourth insulating resin layer and the second semiconductor chip;
forming an opening in the second insulating layer, the fourth insulating resin layer, the first insulating layer and the second insulating resin layer to expose the electrode formed in the semiconductor wafer;
filling the opening with a conductive material;
forming a line on the second insulating layer, the line being connected with the conductive material filling the opening;

forming a first terminal electrically connected with the line; and grinding the semiconductor wafer until a thickness of the semiconductor wafer reaches a predetermined thickness.

12. The manufacturing method for a semiconductor device according to claim 11, wherein the semiconductor wafer includes a plurality of device areas each including a third semiconductor element formed therein.

13. The manufacturing method for a semiconductor device according to claim 12, wherein a plurality of the first semiconductor chips are connected with each of the plurality of device areas.

14. The manufacturing method for a semiconductor device according to claim 13, further comprising electrically connecting the electrode formed in each of the device areas of the semiconductor wafer and a fourth semiconductor element formed in at least one third semiconductor chip to each other via the first bump.

15. The manufacturing method for a semiconductor device according to claim 11, wherein the grinding of the semiconductor wafer until the thickness of the semiconductor wafer reaches the predetermined thickness is to grind the semiconductor wafer until the thickness of the semiconductor wafer reaches a finish thickness.

16. The manufacturing method for a semiconductor device according to claim 12, wherein the grinding of the semiconductor wafer until the thickness of the semiconductor wafer reaches the predetermined thickness is to grind the semiconductor wafer until the thickness of the semiconductor wafer reaches a finish thickness.

17. The manufacturing method for a semiconductor device according to claim 13, wherein the grinding of the semiconductor wafer until the thickness of the semiconductor wafer reaches the predetermined thickness is to grind the semiconductor wafer until the thickness of the semiconductor wafer reaches a finish thickness.

18. The manufacturing method for a semiconductor device according to claim 16, wherein:

the semiconductor wafer includes a second embedded electrode having one of two ends thereof electrically connected with the third semiconductor element; and the manufacturing method further comprises:

after forming the first terminal, grinding the semiconductor wafer to a position slightly before the other of the two ends of the second embedded electrode;

exposing the other end of the second embedded electrode; and forming a second terminal electrically connected with the exposed other end of the second embedded electrode.

19. The manufacturing method for a semiconductor device according to claim 17, wherein:

the semiconductor wafer includes a second embedded electrode having one of two ends thereof electrically connected with the third semiconductor element; and the manufacturing method further comprises:

after forming the first terminal, grinding the semiconductor wafer to a position slightly before the other of the two ends of the second embedded electrode;

exposing the other end of the second embedded electrode; and forming a second terminal electrically connected with the exposed other end of the second embedded electrode.

20. The manufacturing method for a semiconductor device according to claim 16, further comprising:

before connecting the electrode and the first embedded electrode by a bump, forming a groove having a width greater than a dicing width in the semiconductor wafer, along a border between the plurality of device areas; and after grinding the semiconductor wafer until the thickness of the semiconductor wafer reaches the finish thickness, separating the semiconductor wafer into individual pieces;

wherein the separation of the semiconductor wafer into individual pieces is to separate the semiconductor wafer along the groove formed in the semiconductor wafer, with the dicing width narrower than the width of the groove.

21. The manufacturing method for a semiconductor device according to claim 20, wherein the groove has a depth greater than, or equal to, the finish thickness.

* * * * *